(12) United States Patent
Kuo et al.

(10) Patent No.: US 12,308,282 B2
(45) Date of Patent: May 20, 2025

(54) INTERCONNECT STRUCTURE WITHOUT BARRIER LAYER ON BOTTOM SURFACE OF VIA

(71) Applicant: Taiwan Semiconductor Manufacturing Co., Ltd., Hsinchu (TW)

(72) Inventors: Tz-Jun Kuo, Hsinchu (TW); Chien-Hsin Ho, Taichung (TW); Ming-Han Lee, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 205 days.

(21) Appl. No.: 17/734,683

(22) Filed: May 2, 2022

(65) Prior Publication Data
US 2022/0262675 A1    Aug. 18, 2022

Related U.S. Application Data

(62) Division of application No. 16/593,562, filed on Oct. 4, 2019, now Pat. No. 11,322,391, which is a division
(Continued)

(51) Int. Cl.
*H01L 21/768* (2006.01)
*H01L 23/522* (2006.01)
*H01L 23/532* (2006.01)

(52) U.S. Cl.
CPC .. *H01L 21/76802* (2013.01); *H01L 21/76831* (2013.01); *H01L 21/76844* (2013.01);
(Continued)

(58) Field of Classification Search
CPC ......... H01L 21/76802; H01L 21/76831; H01L 21/76844; H01L 21/76846;
(Continued)

(56) References Cited

U.S. PATENT DOCUMENTS 5,049,975 A  *  9/1991  Ajika ................ H01L 23/53223
                                                257/751
5,486,492 A  *  1/1996  Yamamoto ........ H01L 21/76843
                                                438/629
(Continued)

FOREIGN PATENT DOCUMENTS

CN       101110386 A      1/2008
CN       101390204 A      3/2009
(Continued)

OTHER PUBLICATIONS

Office Action, dated Feb. 19, 2021, for Taiwan Intellectual Property Office Appl. No. 106138493, 6 pages.

*Primary Examiner* — Ictor A Mandala
*Assistant Examiner* — Colleen E Snow
(74) *Attorney, Agent, or Firm* — Sterne, Kessler, Goldstein & Fox P.L.L.C.

(57) ABSTRACT

Embodiments and methods of an interconnect structure are provided. The interconnect structure includes a via, a trench that has an overlapping area with a top of the via, and a first layer of conducting material that has an overlapping area with a bottom of the via. The interconnect also includes a second layer of conducting material formed in the via, and a third layer of conducting material formed in the trench. The second layer of conducting material is in contact with the first layer of conducting material without a barrier in between the two conducting materials. The absence of the barrier at the bottom of the via can reduce the contact resistance of the interconnect structure.

20 Claims, 18 Drawing Sheets

Related U.S. Application Data of application No. 15/679,385, filed on Aug. 17, 2017, now Pat. No. 10,453,740.

(60) Provisional application No. 62/526,420, filed on Jun. 29, 2017.

(52) U.S. Cl.
CPC .. *H01L 21/76846* (2013.01); *H01L 21/76847* (2013.01); *H01L 21/76867* (2013.01); *H01L 21/76877* (2013.01); *H01L 21/76879* (2013.01); *H01L 23/5226* (2013.01); *H01L 23/53209* (2013.01); *H01L 23/53238* (2013.01); *H01L 23/5329* (2013.01); *H01L 23/53223* (2013.01); *H01L 23/53252* (2013.01)

(58) Field of Classification Search
CPC ......... H01L 21/76847; H01L 21/76867; H01L 21/76877; H01L 21/76879; H01L 23/5226; H01L 23/53209; H01L 23/53238; H01L 23/5329; H01L 23/53223; H01L 23/53252

See application file for complete search history.

(56) References Cited

U.S. PATENT DOCUMENTS

| | | | |
|---|---|---|---|
| 6,323,131 | B1 | 11/2001 | Obeng et al. |
| 6,495,449 | B1 | 12/2002 | Nguyen |
| 7,056,826 | B2 | 6/2006 | Wu et al. |
| 8,232,200 | B1 | 7/2012 | Oh et al. |
| 10,566,231 | B2 | 2/2020 | O'Toole et al. |
| 2003/0214043 | A1 | 11/2003 | Saitoh et al. |
| 2004/0087148 | A1 | 5/2004 | Wong |
| 2005/0082606 | A1 | 4/2005 | Grunow et al. |
| 2005/0106865 | A1* | 5/2005 | Chung ............... C23C 16/45504 438/680 |
| 2005/0142874 | A1 | 6/2005 | Keum |
| 2005/0191855 | A1 | 9/2005 | Chen et al. |
| 2007/0205482 | A1 | 9/2007 | Yang et al. |
| 2008/0014741 | A1 | 1/2008 | Chen et al. |
| 2008/0173547 | A1 | 7/2008 | Ohba et al. |
| 2008/0251919 | A1 | 10/2008 | Shih et al. |
| 2010/0009530 | A1 | 1/2010 | Haneda et al. |
| 2010/0181682 | A1 | 7/2010 | Arai |
| 2010/0267231 | A1 | 10/2010 | van Schravendijk et al. |
| 2013/0109172 | A1* | 5/2013 | Collins ............. H01L 21/76843 438/653 |
| 2014/0027908 | A1 | 1/2014 | Tsai et al. |
| 2014/0183738 | A1 | 7/2014 | Jezewski et al. |
| 2015/0228585 | A1* | 8/2015 | He .................... H01L 21/76843 438/643 |
| 2015/0270225 | A1 | 9/2015 | Yang et al. |
| 2015/0287675 | A1 | 10/2015 | Shaviv |
| 2015/0340317 | A1 | 11/2015 | Choi et al. |
| 2016/0118296 | A1 | 4/2016 | Kolics et al. |
| 2016/0190060 | A1 | 6/2016 | Bristol et al. |
| 2017/0084483 | A1* | 3/2017 | Yang ................ H01L 23/53271 |
| 2018/0005939 | A1* | 1/2018 | Hu ................... H01L 21/76802 |

FOREIGN PATENT DOCUMENTS

| | | |
|---|---|---|
| CN | 104813446 A | 7/2015 |
| CN | 104934412 A | 9/2015 |
| CN | 104979278 A | 10/2015 |
| TW | 200539388 A | 12/2005 |
| TW | 200816379 A | 4/2008 |

\* cited by examiner

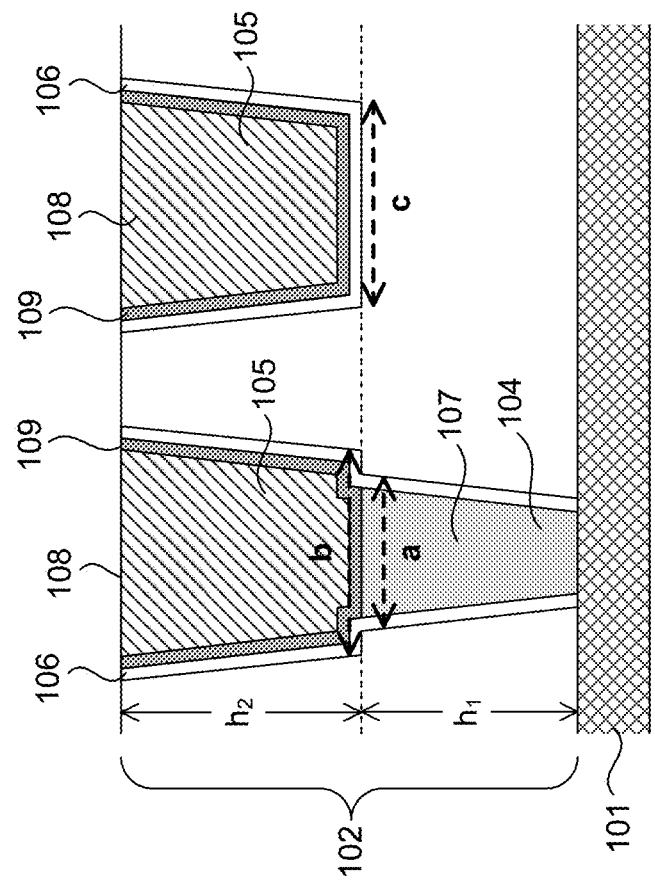
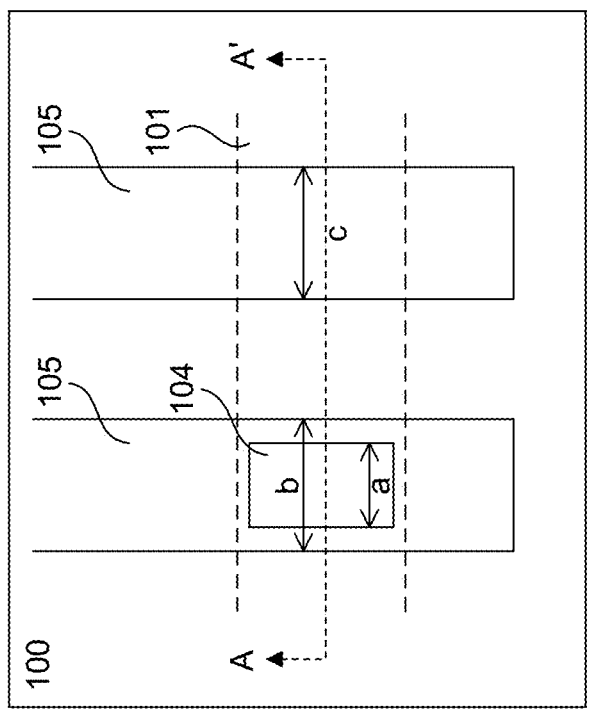
FIG. 1B
FIG. 1A

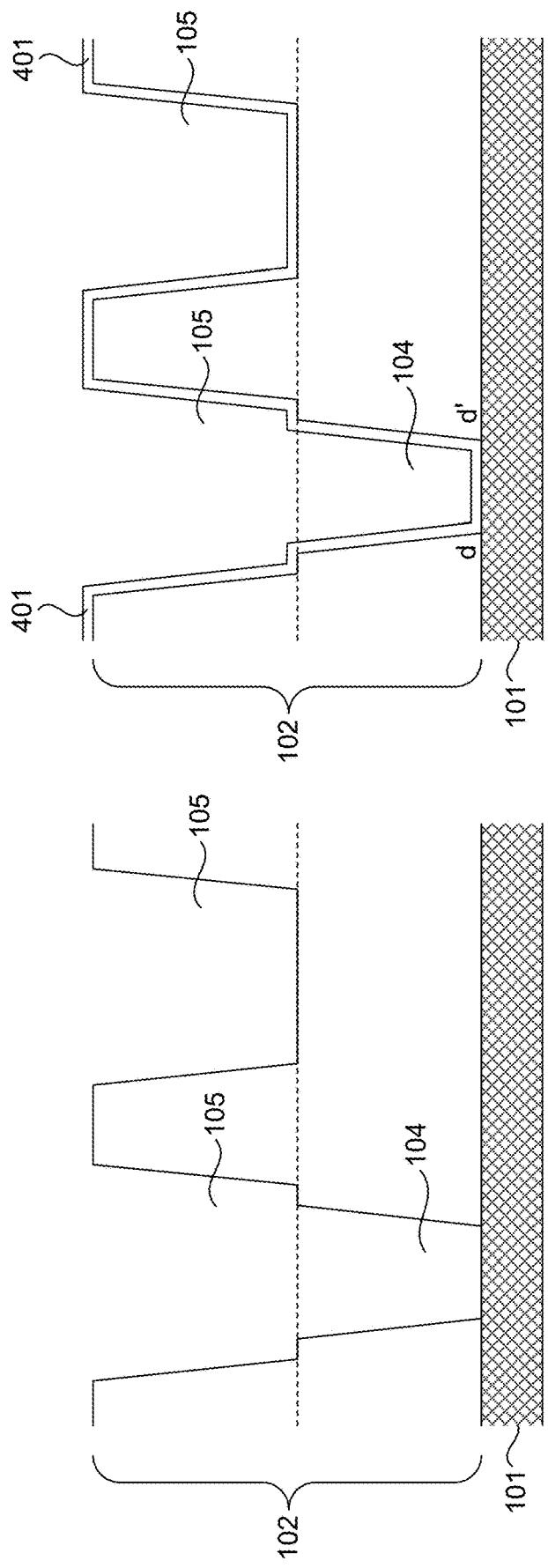

INTERCONNECT STRUCTURE WITHOUT BARRIER LAYER ON BOTTOM SURFACE OF VIA

CROSS-REFERENCE TO RELATED APPLICATIONS

This application is a divisional of U.S. Non-Provisional patent application Ser. No. 16/593,562, filed on Oct. 4, 2019, titled "Interconnect Structure Without Barrier Layer On Bottom Surface of Via," which is a divisional of U.S. Non-Provisional patent application Ser. No. 15/679,385, filed on Aug. 17, 2017, titled "Interconnect Structure Without Barrier Layer On Bottom Surface of Via," which claims the benefit of U.S. Provisional Patent Application No. 62/526,420, filed on Jun. 29, 2017, titled "Interconnect Structure Without Barrier Layer On Bottom Surface of Via." The entire contents of the aforementioned applications are incorporated by reference herein in their entireties.

BACKGROUND

With advances in semiconductor technology, interconnect dimensions are shrinking to accommodate increasing device densities. Such scaling down in interconnect dimensions has increased the complexity of semiconductor manufacturing processes for fabricating interconnects with low resistance and high reliability.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIG. 1A is a top down view of an exemplary interconnect structure according to some embodiments.

FIG. 1B is a cross-sectional view of FIG. 1A along cross sectional line A-A', according to some embodiments.

FIGS. 4A to 4G are cross sectional views of exemplary interconnect structures with a selective removal of a portion of a via-plus-trench barrier, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figures 2A, 2B:
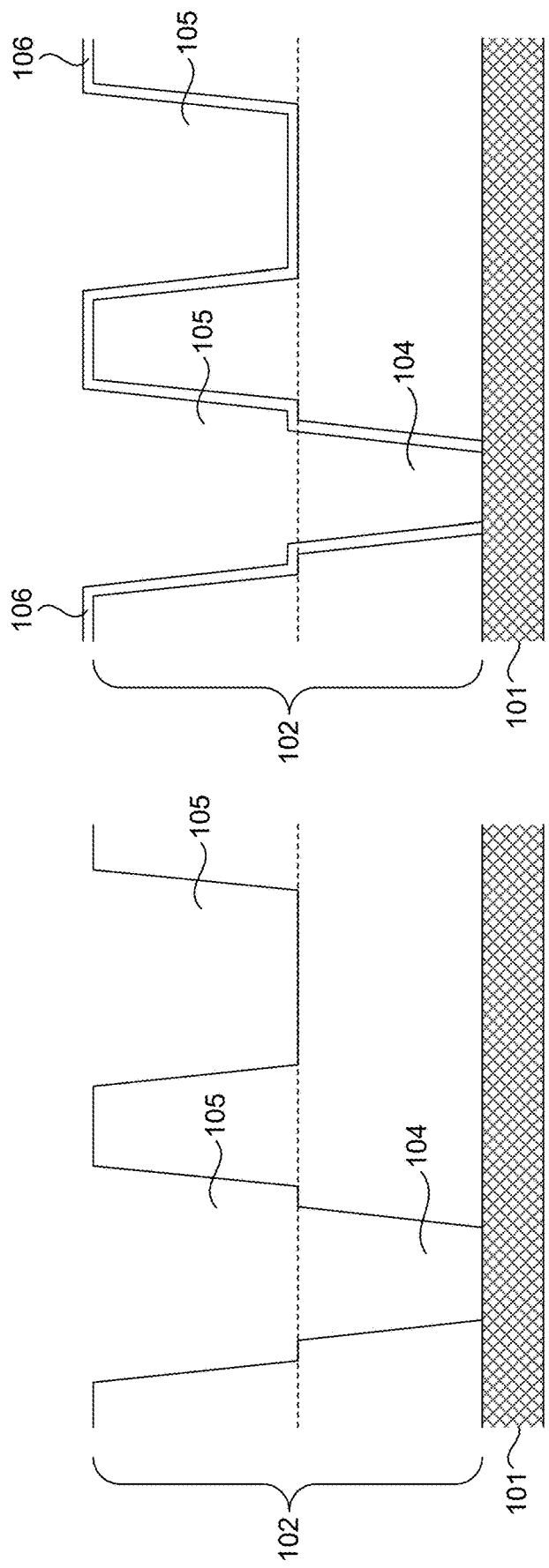
FIGS. 2A to 2F are cross sectional views of exemplary interconnect structures during formation, according to some embodiments.

The following disclosure provides many different embodiments, or examples, for implementing different features of the provided subject matter. Specific examples of components and arrangements are described below to exemplify the present disclosure. These examples are not intended to be limiting. In addition, the present disclosure may repeat reference numerals and/or letters in the various examples. This repetition does not in itself dictate a relationship between the various embodiments and/or configurations discussed.

Spatially relative terms, such as "on," "in," "over," "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, unless noted otherwise.

As used herein, the term "selectivity" refers to the ratio of growth rates, deposition rates, etching rates or removal rates between two materials under the same process conditions. The term "selective", "selectively," "exclusive," and "exclusively" are used when the growth rate, deposition rate, etching rate or removal rate of a material on an intended surface is at least 10 times higher than that on an un-intended surface. The term "minimal" is used when the thickness of a material is less than the thickness of a monolayer of the material.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as, for example, silicon, germanium, gallium arsenide, indium phosphide, etc. Alternatively, the substrate may be an electrically non-conductive material such as, for example, glass or sapphire wafer.

As used herein, the term "high-k" refers to a high dielectric constant. In the field of semiconductor device structures and manufacturing processes, high-k refers to a dielectric constant that is greater than the dielectric constant of SiO2 (i.e., greater than 3.9).

As used herein, the term "vertical" means nominally perpendicular to the surface of a substrate.

As used herein, the term "via" refers to a vertical hole that has a top, a bottom and a sidewall. The top of a via refers to a higher boundary of the via, and the bottom of a via refers to a lower boundary of the via. Lower and higher both refer to vertical locations, with the substrate at lower direction.

As used herein, the term "trench" refers to a box like structure with a top, a bottom, and at least a sidewall. A trench usually has a length that is larger than its width. A trench does not necessarily have sharp corners or sharp edges. A trench can have different sections with different sizes, different shapes, and different length directions.

As used herein, the term "form" or "formed" refers to one or more steps of adding or removing one or more components.

This disclosure provides various exemplary interconnect structures in semiconductor devices. This disclosure also provides exemplary methods for fabricating the interconnect structures with lower interconnect resistance and lower contact resistance in small dimension and high aspect ratio structures.

FIG. 1A is a top down view of an exemplary interconnect structure, according to some embodiments. FIG. 1B is a cross-sectional view of FIG. 1A along cross sectional line A-A', according to some embodiments. In referring to FIG. 1A, an interconnect structure is formed above a substrate 100. In some embodiments, an under-layer conductor 101 can be formed above the substrate 100. For example, under-layer conductor 101 can be formed to be in contact with the substrate 100. Alternatively, one or more intermediate layers of, for example, an interconnect or an insulating material can be formed between the under-layer conductor 101 and the substrate 100. In some embodiments, the under-layer conductor 101 can be a patterned layer of metal for an interconnect. This patterned layer of metal can include metals and/or barriers to prevent diffusion of the metal into the under-layer conductor 101. In some embodiments, the under-layer conductor 101 can be a patterned layer of conducting area formed on silicon (Si) such as, for example, implanted source or drain areas for a field-effect-transistor (FET) device.

In referring to FIG. 1B, a layer of insulating material 102 is formed above the under-layer conductor 101. The insulating material 102 can be made from insulating materials. The insulating materials include, for example, non-doped silicon dioxide, doped silicon dioxide, silicon nitride with or without dopants, and silicon oxy-nitride with and without dopants. In some embodiments, the insulating material 102 can include a plurality of layers made from different insulating materials, according to some embodiments.

In referring to FIG. 1A, a via 104 and a trench 105 can be formed in the layer of insulating material 102. In referring to FIG. 1B, the cross-sectional view illustrates that the bottom of the via 104 contacts a portion of the top surface of the under-layer conductor 101. The top of the via 104 contacts a portion of a bottom of the trench 105. FIGS. 1A and 1B show that the width of the bottom of the trench 105 (annotated as 'b' in FIG. 1A) is larger than the width of the top of the via 104 (annotated as 'a' in FIG. 1A) at an overlapping area of the two interconnect structures. The width of the trench 105 can be larger than, smaller than, or the same as the width of the via 104. The width of the trench 105 (annotated as 'c' in FIG. 1A) in a non-overlapping area can also be larger than, smaller than, or the same as the width b of the trench 105 at the overlapping area. In some embodiments, each of the widths a, b, and c is between 1 nm and 50 nm. For example, each of the widths a, b, and c can be between 10 and 30 nm (e.g., about 20 nm). In some embodiments, the average widths of trench can be between 10 and 30 nm. In some embodiments, the aspect ratio (i.e., the ratio between the height and the width) of the via can be between 0.5 and 100. For example, the aspect ratio of the via can be greater than 10. In some embodiments, the aspect ratio of the trench can be between 0.5 and 10. In some embodiments, via 104 and trench 105 can have respective heights h1 and h2. In some embodiments, the height ratio h1/h2 can be less than about 1 or greater than about 20. In some embodiments, the height ratio h1/h2 can be in a range of about 1 and about 20. In referring to FIG. 1A, a top portion of the via has a rectangular shape. The via can take different shapes (e.g., circular, oval-shaped, rectangular with rounded corners, etc.).

Referring to FIG. 1B, in some embodiments, a layer of via-plus-trench barrier 106 is formed after forming the via 104 and the trench 105. In some embodiments, the layer of via-plus-trench barrier 106 is formed on the sidewalls of the trench 105, the bottom of the trench 105, and the sidewalls of the via 104. Minimal or no via-plus-trench barrier 106 is formed over the overlapping area between the via 104 and the under-layer conductor 101.

In some embodiments, the thickness of the via-plus-trench barrier 106 thickness is between 1 Å and 50 Å. In some embodiments, the thickness of the selective via-plus-trench barrier 106 thickness is between 5 Å and 30 Å or between 15 Å and 25 Å. As interconnect dimensions are shrinking to accommodate increasing device densities, a via-plus-trench barrier layer with lower thickness can be selected to increase the proportion of conductive material in the interconnect structures. For example, the thickness of via-plus-trench barrier 106 can be between 1 Å and 20 Å. The via-plus-trench barrier 106 can include a metal (e.g., tantalum (Ta), titanium tungsten (TiW), and/or other metal or metal alloys), a metal oxide (e.g., alumina, manganese oxide, chromium oxide, niobium oxide, titanium oxide, and/or combinations thereof), a metal nitride (e.g. TaN, titanium nitride (TiN)), an organo-silane (e.g., trimethoxysilane with long alkyl chain), an organo-phosphane, other suitable materials, and/or combinations thereof.

Referring to FIG. 1B, in some embodiments, a trench barrier 109 is formed on the sidewalls of the trench 105 and the bottom of the trench 105. The trench barrier 109 is in contact with the via-plus-trench barrier 106 and the top surface of a via conductor 107.

In some embodiments, the trench barrier 109 includes a metal (e.g., tantalum (Ta)), metal (e.g., Ta, TiW, and/or other metal or metal alloys), a metal oxide (e.g., alumina, manganese oxide, chromium oxide, niobium oxide, titanium oxide, and/or combinations thereof), a metal nitride (e.g. TaN, titanium nitride), a metal compound (e.g., alumina, manganese oxide, chromium oxide, niobium oxide, titanium oxide, and/or combinations thereof), a carbon containing material (e.g., graphene), other suitable materials, and/or combinations thereof. For example, a graphene-based trench barrier layer 109 can be formed through any suitable methods such as, for example, by chemical vapor deposition (CVD), plasma enhanced chemical vapor deposition (PECVD), other deposition processes, and/or combinations thereof. In some embodiments, a passivation layer is deposited on exposed metal surfaces prior to the formation of a graphene-based trench barrier layer. The passivation layer can be formed of any suitable material such as, for example, aromatic compounds, long carbon chain with functional groups, other suitable materials, and/or combinations thereof. In some embodiments, the functional groups can include acid, amine, phosphine, other suitable functional groups, and/or combinations thereof. In some embodiments, a catalyst layer can also be formed on exposed dielectric surfaces in trench 105 prior to the deposition of graphene material. In some embodiments, the catalyst layer is not formed on the surfaces of via conductor 107 in trench 105. The catalyst layer can be formed of iron (Fe), nickel (Ni), cobalt (Co), other suitable material, and/or combinations thereof. The passivation layer and the catalyst layer can react with precursors in a CVD or PECVD process to form a graphene-based trench barrier layer. In some embodiments, the thickness of the trench barrier 109 is between 1 Å and 50 Å. In some embodiments, the thickness of the trench barrier 109 is between 5 Å and 30 Å. In some embodiments, the thickness of the trench barrier 109 is between 15 Å and 25 Å. In some embodiments, the thickness of trench barrier 109 is between 1 Å and 20 Å.

In referring to FIG. 1B, the via 104 is filled with a via conductor 107. The trench 105 is filled with a trench conductor 108. As illustrated by FIG. 1B, the via conductor 107 is in contact with the under-layer conductor 101 and the via-plus-trench barrier 106. The trench conductor 108 is in contact with the trench barrier 109. The trench conductor 108 is electrically coupled to the via conductor 107 at the overlapping area between the trench 105 and the via 104.

As illustrated in FIG. 1B, a top surface of the via conductor 107 is at or approximately at same level as a top interface of the via 104. In some embodiments, the top surface of the via conductor 107 can be higher or lower than the top interface of the via 104.

FIGS. 2A to 2F are cross sectional views of exemplary interconnect structures during formation of the interconnect structure shown in FIG. 1B, according to some embodiments. In some embodiments, the interconnect structure is formed on the substrate 100 (not shown in FIGS. 2A to 2F). The under-layer conductor 101 is formed on the substrate 100. In some embodiments, the under-layer conductor 101 includes copper (Cu), cobalt (Co), nickel (Ni), ruthenium (Ru), rhodium (Rh), iridium (Ir), osmium (Os), aluminum (Al), indium (In), tungsten (W), or carbon nanotubes. In some embodiments, the under-layer conductor 101 includes metals alloyed with boron (B), aluminum (Al), titanium (Ti), chromium (Cr), manganese (Mn), niobium (Nb), palladium (Pd), silver (Ag), indium (In), or gold (Au). The layer of insulating material 102 is formed over the under-layer conductor 101. In some embodiments, the layer of insulating material 102 is formed by chemical vapor deposition (CVD), plasma enhanced chemical vapor deposition (PECVD), a spin-on process, physical vapor deposition (PVD), or atomic layer deposition (ALD). In some embodiments, the layer of insulating material 102 includes silicon oxide (SiOx), doped silicate glass, and/or low-k dielectrics.

Referring to FIG. 2A, the via 104 and the trench 105 are formed in the layer of insulating material 102. A plurality of photolithography, deposition, dry etch, and wet etch steps can be employed to define the patterns and form the via 104 and the trench 105 in the layer of insulating material 102. In some embodiments, the via 104 and the trench 105 are formed using separate etch steps. In some embodiments, the via 104 and the trench 105 are formed using the same etch step.

Referring to FIG. 2B, the layer of via-plus-trench barrier 106 is formed selectively on the sidewall of the trench 105, the bottom of the trench 105, and the sidewall of the via 104, according to some embodiments. Minimal or no via-plus-trench barrier is formed over the overlapping area between the via 104 and the under-layer conductor 101. Various exemplary methods of selectively forming the via-plus-trench barrier 106 illustrated by FIG. 2B are to be discussed in the following paragraphs.

In some embodiments, the selective formation of the via-plus-trench barrier 106 is realized by a selective deposition of the via-plus-trench barrier 106. In some embodiments, the via-plus-trench barrier 106 is formed by a CVD, a PECVD, an ALD, or a SAM process that deposits the via-plus-trench barrier 106 on the surface of the insulating materials 102. In some embodiments, the precursors of the CVD or ALD process have a very high selectivity of reactions between insulating materials (e.g., the layer of insulating material 102) and conducting materials (e.g., under-layer conductor 101). For example, the precursor can be selected to have greater affinity to dielectric surfaces. In addition, a passivation layer can be absorbed on the metal surfaces to enhance the selectivity of the CVD or ALD process. The passivation layer can be, for example, organic acid, thiol, amine, phosphine, other suitable passivation layer, or combinations thereof. As a result, the deposition of the via-plus-trench barrier 106 occurs on the insulating material 102 but the deposition is minimal on the under-layer conductor 101. In some embodiments, the via-plus-trench barrier 106 is not deposited on the under-layer conductor 101. In some embodiments, the processing temperature can be in a range between about 10° C. and about 400° C.

In some embodiments, the via-plus-trench barrier 106 is a Si containing diffusion barrier, and the precursors of the CVD, PECVD or ALD process contain Si or Si compounds. The CVD, PECVD or ALD process is an oxidizing process that favors Si surface with dangling Si bonds, Si—H bond, Si—C bond, or Si—O bond. The oxidizing process is inhibited on a metallic surface or a highly doped Si surface where the dangling bonds do not exist. The precursor molecules favorably adsorbs on the insulating material 102 with dangling Si bonds, Si—H bond or Si—O bond and reacts with the insulating material surface to create the layer of via-plus-trench barrier 106. Meanwhile, minimal to no reaction occurs on the surface of the under-layer conductor 101, thus minimal to no via-plus-trench barrier 106 is formed on the under-layer conductor 101. Examples of Si containing diffusion barrier layer can be organosilicate, silicon nitride, silicon carbide, silicon carbon nitride, silicon oxycarbide, other suitable material, and/or combinations thereof.

In some embodiments, the via-plus-trench barrier 106 is enabled by a selective self-assembled-monolayer (SAM) process. In some embodiments, the selective SAM process is a vapor phase or a liquid phase process that forms one or more monolayers of molecules of SAM material on the surface of the insulating material 102. In some embodiments, the SAM material includes an organo-silane or an organo-phosphane, and the SAM material acts as the via-plus-trench barrier 106. In some embodiments, the SAM material acts as an nucleation layer or an enhancer layer to initiate or enhance the subsequent formation of the via-plus-trench barrier 106. In some embodiments, the selective SAM process forms one or more monolayers of molecules on the surface of the under-layer conductor 101. The selective SAM material acts as an inhibitor to subsequent barrier deposition process. Due to the existence of the selective SAM material, the via-plus-trench barrier 106 deposition is delayed or inhibited on the surface of conducting material. As a result, the via-plus-trench 106 is formed on the surface of the insulating materials 102, while minimal or no via-plus-trench barrier 106 is formed on the surface of the under-layer conductor 101.

According to some embodiments of the present disclosure, the process temperatures of the CVD, PECVD, ALD or SAM process for forming the via-plus-trench barrier 106 is at or below 400° C. and greater than 10° C.

After the selective formation of via-plus-trench barrier 106, the via 104 and the trench 105 are filled with conducting materials. In some embodiments, the via 104 and the trench 105 are filled using separate steps with a single damascene process.

Figure 2D:
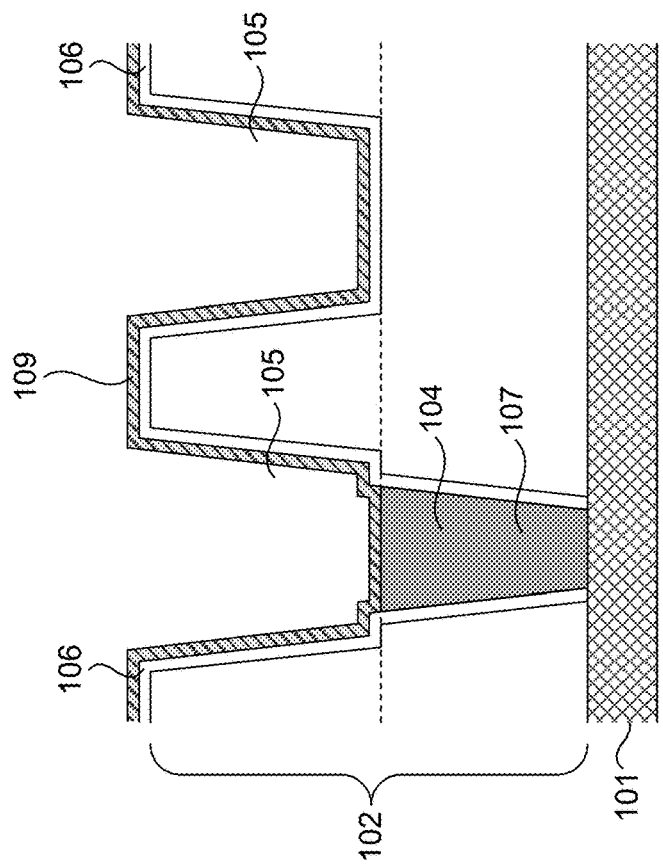
Figure 2C:
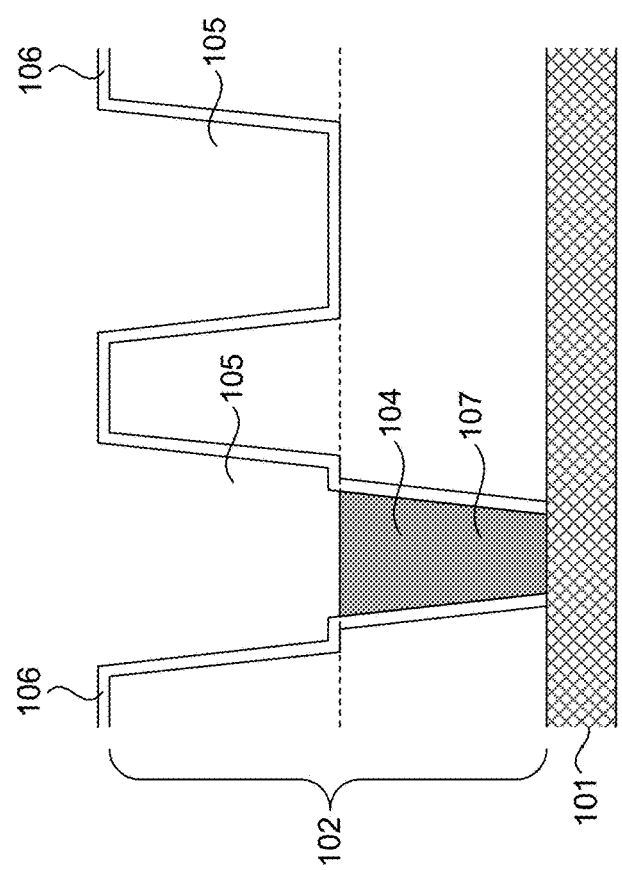

Referring to FIG. 2C, in a single damascene process, the via 104 is first filled with the via conductor 107. In some embodiments, the formation of the via conductor 107 in the via 104 is a selective deposition process. Such selective deposition process deposits the via conductor 107 selectively on the bottom of the via 104 where there is an overlapping area between the bottom of the via 104 and the under-layer conductor 101. As a result, the deposition of the via conductor 107 progresses in a bottom-up fashion that gradually fills the via 104 from the bottom of the via to the top of the via.

In some embodiments, the selective deposition process includes a CVD process, an ALD process, or an electroless deposition (ELD) process. In some embodiments, the selective deposition process is a selective metal deposition process that fills the via with metal in a bottom-up fashion. For example, copper (Cu) can be selectively deposited in a bottom-up fashion using ELD. In some embodiments, the selective deposition process is a selective CVD process that fills the via with metal in a bottom-up fashion. For example, cobalt (Co) can be formed in a bottom-up fashion using selective CVD. In some embodiments, the selectivity of the selective CVD Co process is realized by choosing an appropriate precursor that forms a nucleation layer on the surface of the under-layer conductor 101. In some embodiments, the Co precursor includes a Co containing compound that has —CO— groups and organic ligands in its molecule structure.

In some embodiments, as illustrated by FIG. 2C, the deposition of the via conductor 107 stops when the top surface of the via conductor 107 is at or about at the same level of the top opening of the via 104. The top surface of the via conductor 107 can also be at a level that is higher or lower than the top opening of the via 104. The different levels of the top surface of the via conductor 107 can be due to design or due to process variation.

In some embodiments, the via conductor 107 includes Cu, Co, nickel (Ni), ruthenium (Ru), rhodium (Rh), iridium (Ir), osmium (Os), aluminum (Al), indium (In), tungsten (W), or carbon nanotubes (CNTs). In some embodiments, a catalytic layer such as Cu is deposited in the via followed by a CVD process with carbon source such as, for example, methane, ethylene, acetylene, other suitable carbon sources, and/or combinations thereof.

Referring to FIG. 2D, after the formation of the via conductor 107 in the via 104, the trench barrier 109 is formed on the upper surface of the trench 105, the sidewall surfaces of the trench 105 and the bottom of the trench 105. In some embodiments, the trench barrier 109 is in contact with the via conductor 107 at the overlapping area between the trench 105 and the via 104. In some embodiments, the formation of the trench barrier 109 is enabled by a PVD process, a CVD process, an ALD process, or an ELD process. In some embodiments, the process temperature for forming the trench barrier 109 is at or below 400° C. and greater than 10° C.

In some embodiments, the trench barrier 109 includes a metal (e.g., Ta, TiW, and/or other metal or metal alloys), a metal oxide (e.g., alumina, manganese oxide, chromium oxide, niobium oxide, titanium oxide, and/or combinations thereof), a metal nitride (e.g. TaN, TiN), a metal compound (e.g., alumina, manganese oxide, chromium oxide, niobium oxide, titanium oxide, and/or combinations thereof), a carbon containing material, other suitable materials, and/or combinations thereof. In some embodiments, the thickness of the trench barrier 109 is between 1 Å and 50 Å. In some embodiments, the thickness of the trench barrier 109 thickness is between 10 Å and 30 Å. In some embodiments, the thickness of the trench barrier 109 thickness is between 15 Å and 25 Å.

Figures 2E, 2F:
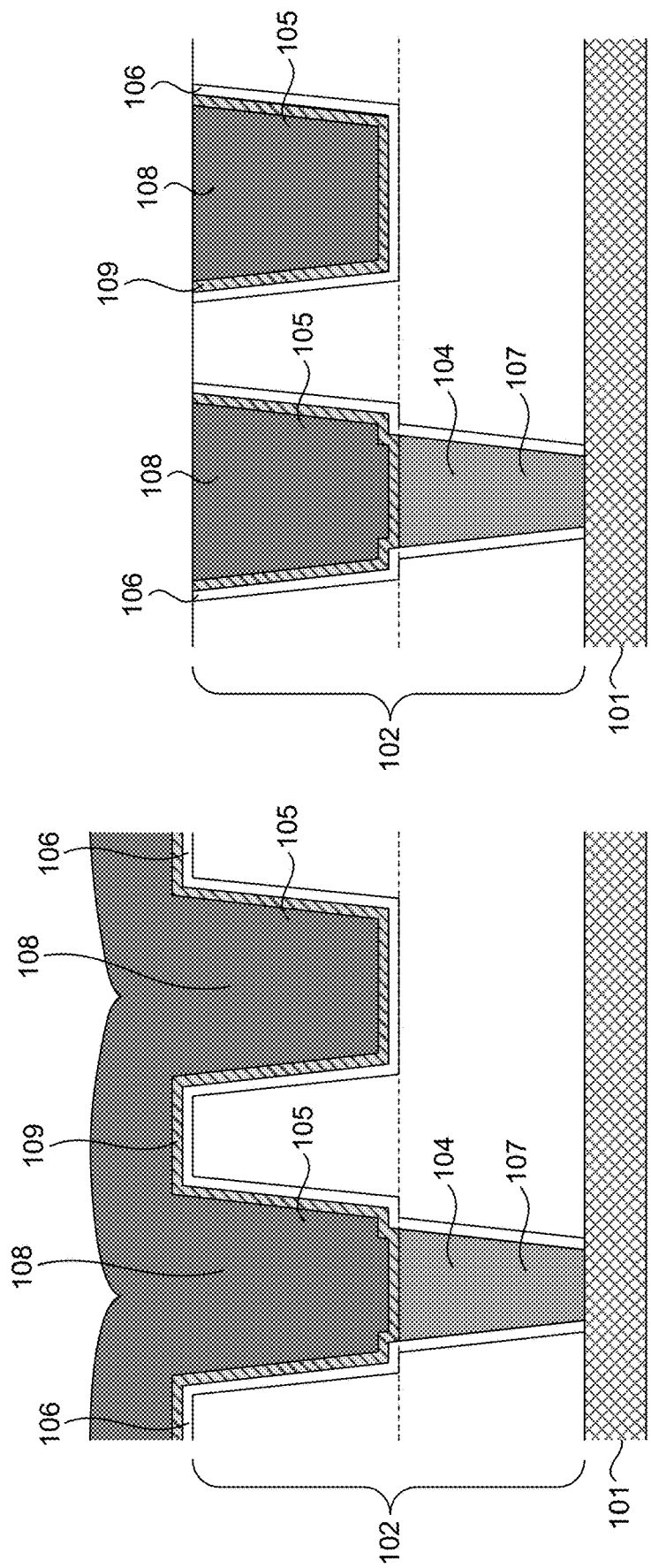

Referring to FIG. 2E, subsequent to the formation of the trench barrier 109, the trench conductor 108 is formed in the trench 105, according to some embodiments. In some embodiments, the formation process of the trench conductor 108 includes a PVD process, a CVD process, an ALD process, or an ELD process. In some embodiments, the trench conductor 108 includes Cu, Co, Ni, Ru, Rh, Ir, Os, Al, In, Ag, Au, W, or carbon nanotubes.

Referring to FIG. 2F, in some embodiments, the excess via-plus-trench barrier 106, trench barrier 109, and trench conductor 108 over the upper surface of the insulating material 102 are removed by a CMP process. As a result, the upper surface of the insulating material 102 is planarized and no excessive conducting material is left on the upper surface of the insulating material 102.

Figures 3A, 3B:
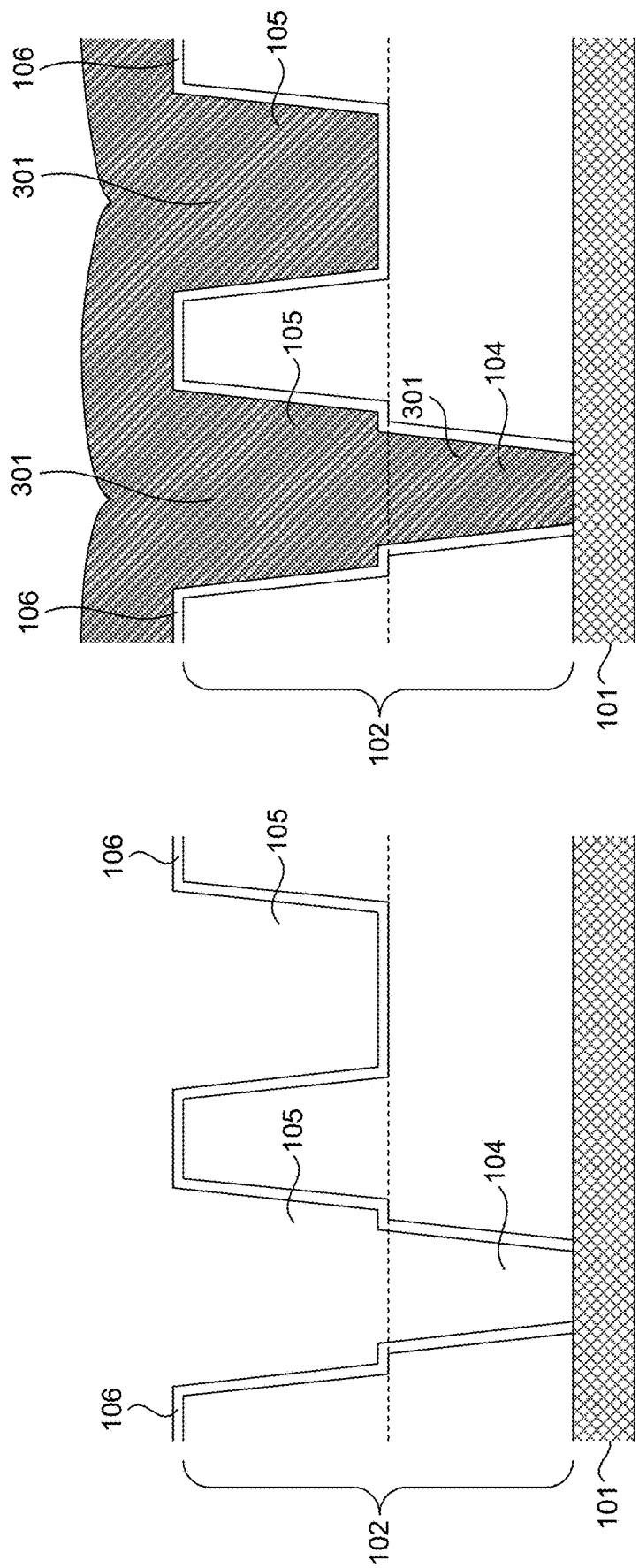
FIGS. 3A to 3C are cross sectional views of an exemplary interconnect structure formed with a dual damascene process, according to some embodiments.
Figure 3C:
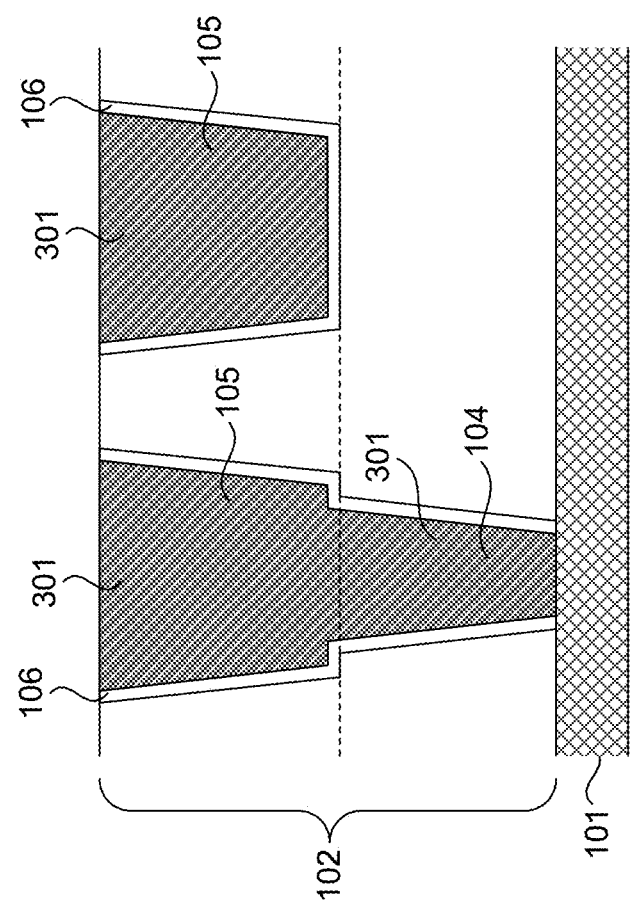

In some embodiments, an interconnect can be formed in the via and trench using a dual damascene process. FIGS. 3A to 3C are cross sectional views of an exemplary interconnect structure formed with the dual damascene process, according to some embodiments. The interconnect structure is formed on the substrate 100 (not shown in FIGS. 3A to 3C).

Referring to FIG. 3A, the layer of via-plus-trench barrier 106 is formed selectively on the sidewall of the trench 105, the bottom of the trench 105, and the sidewall of the via 104, according to some embodiments. Minimal or no via-plus-trench barrier is formed over the overlapping area between the via 104 and the under-layer conductor 101. Various exemplary methods of selectively forming the via-plus-trench barrier 106 illustrated by FIG. 3A are previously discussed in FIG. 2B.

Referring to FIG. 3B, in the dual damascene process, the via 104 and trench 105 are filled with a via-plus-trench conductor 301. In some embodiments, the formation process of the via-plus-trench conductor 301 includes a PVD process, a CVD process, an ALD process, and/or an ELD process. In some embodiments, the via-plus-trench conductor includes Cu, Co, Ni, Ru, Rh, Ir, Os, Al, In, Ag, Au, W, or CNTs.

Referring to FIG. 3C, in some embodiments, the excess via-plus-trench barrier 106 and via-plus-trench conductor 301 over the upper surface of the insulating material 102 are removed by a CMP process. As a result, the upper surface of the insulating material 102 is planarized and no excessive conducting material is left on the upper surface of the insulating material 102. Unlike the structure discussed in FIG. 2F where the trench conductor 108 and via conductor 107 are electrically coupled via a trench barrier 106, the interconnect structure in FIG. 3C has one via-plus-trench conductor 301 for both the trench 105 and the via 104 with no interface between the trench conductor and via conductor. The removal of the interface between the trench conductor and the via conductor can result in a reduction in contact resistance between the trench conductor and the via conductor, according to some embodiments.

In some embodiments, the selective formation of the via-plus-trench barrier can be formed by a non-selective deposition of the via-plus-trench barrier followed by a selective removal of a portion of the via-plus-trench barrier. FIGS. 4A to 4G are cross sectional views of forming exemplary interconnect structures with a selective removal of a portion of the via-plus-trench barrier.

Referring to FIG. 4A, the via 104 and the trench 105 are formed in the layer of insulating material 102. A plurality of photolithography, deposition, dry etch, and wet etch steps are employed to define the patterns and form the via 104 and the trench 105 in the layer of insulating material 102. In some embodiments, the via 104 and the trench 105 are formed by separate etch steps. In some embodiments, the via 104 and the trench 105 are formed by the same etch step.

Referring to FIG. 4B, the via-plus-trench barrier 401 is formed non-selectively on the surface of the insulating materials 102 and on the surface of the under-layer conductor 101. A bottom portion of the barrier 401 (d-d') is in contact with a portion of the top surface of the under-layer conductor 101. In some embodiments, the formation process of the via-plus-trench barrier 401 includes ALD, CVD, and/or PVD. In some embodiments, the temperature for the formation process of the via-plus-trench barrier 401 is below 400° C. and greater than 10° C.

Figure 4D:
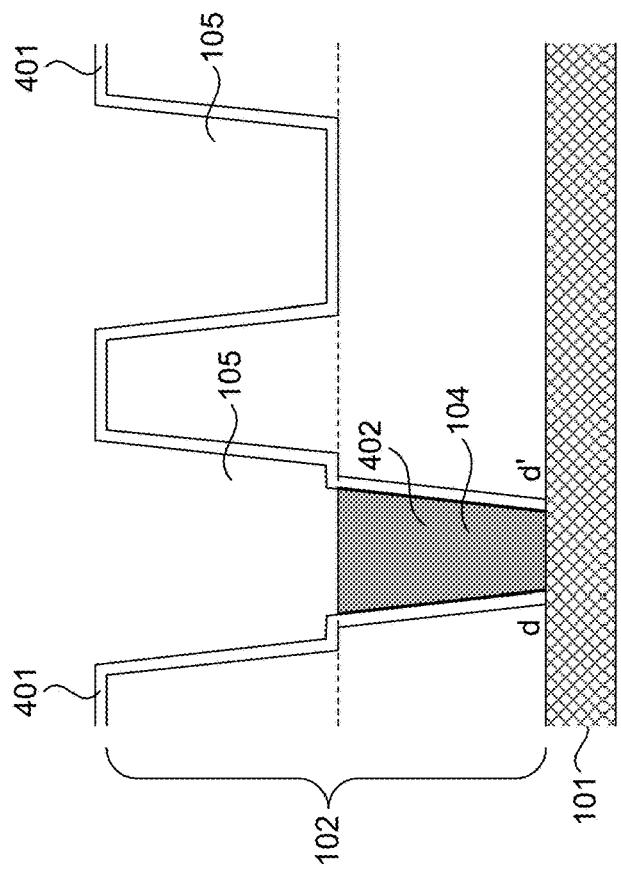
Figure 4C:
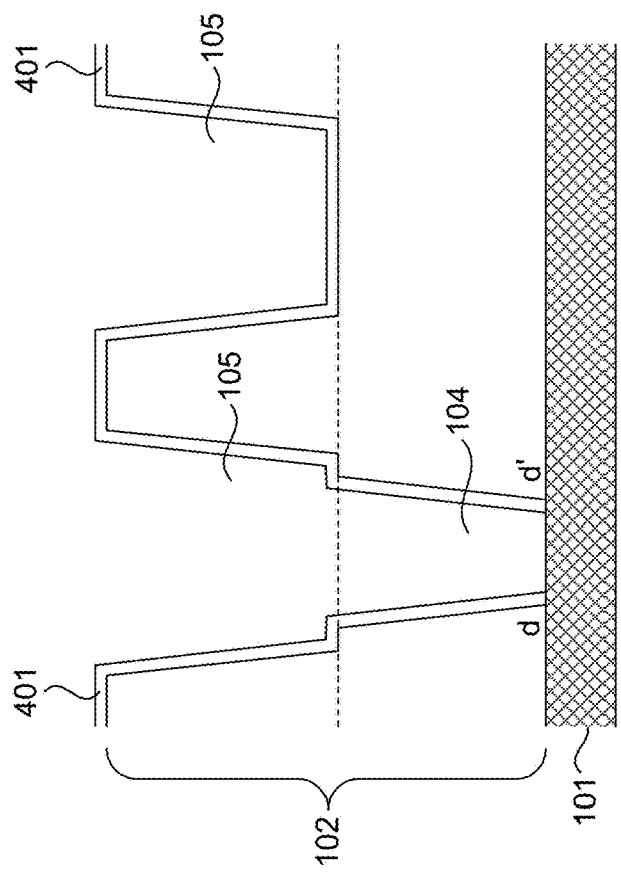

Referring to FIG. 4C, the bottom portion (d-d') of the via-plus-trench barrier 401 is selectively removed, according to some embodiments. In some embodiments, the selective removal can be done with a thermal alloying process. The thermal alloying process can cause an alloy process between the bottom portion (d-d') of the via-plus-trench barrier 401 and the top surface of the under-layer conductor 101. After the alloying process, the bottom portion (d-d') of the via-plus-trench barrier 401 alloys with the top surface of the under-layer conductor 101, leaving the no via-plus-trench barrier on the surfaces of the under-layer conductor 101.

In some embodiments, the selective removal of a bottom portion (d-d') of the via-plus-trench barrier 401 is done by a lift-off process. Prior to the deposition of a via-plus-trench barrier, a layer of sacrificial material can be selectively deposited on the top surface of the under-layer conductor 101 that is open to the bottom of the via 104. A via-plus-trench barrier is then non-selectively deposited on the surface of the insulating material 102 and on the top surface of the sacrificial material. The layer of sacrificial material is subsequently etched in an etchant. In some embodiments, the sacrificial material 303 is an organic SAM layer (e.g., thiol derivatives), and the etchant is an organic solvent (e.g., ethanol) that attacks the organic SAM layer but not the via-plus-trench barrier 401, the under-layer conductor 101, or the insulating material 102. The etching of the sacrificial material lifts off the bottom portion (d-d') of the via-plus-trench barrier 401 As a result, the bottom portion (d-d') of the via-plus-trench barrier 401 is selectively removed.

Referring to FIG. 4D, in a single damascene process, the via 104 is filled with a via conductor 402, according to some embodiments. In some embodiments, the formation of the via conductor 402 in the via 104 is a selective deposition process. Such selective deposition process deposits the via conductor 402 selectively on the bottom of the via 104 where there is an overlapping area between the bottom of the via 104 and the under-layer conductor 101. As a result, the deposition of the via conductor 402 progresses in a bottom-up fashion that gradually fills the via 104 from the bottom of the via to the top of the via.

In some embodiments, the selective deposition process includes a CVD process, an ALD process, or an electroless deposition (ELD) process. In some embodiments, the selective deposition process is a selective metal deposition process that fills the via with in a bottom-up fashion. In some embodiments, Cu is deposited in a bottom-up fashion. In some embodiments, the selective deposition process is a selective CVD process that fills the via with metal in a bottom-up fashion. In some embodiments, Co is deposited in a bottom-up fashion using the selective CVD process. In some embodiments, the selectivity of the selective CVD Co process is realized by choosing an appropriate precursor that forms a nucleation layer on the surface of the under-layer conductor 101. In some embodiments, the Co precursor includes a Co containing compound that has —CO— groups and organic ligands in its molecule structure.

In some embodiments, as illustrated by FIG. 4D, the deposition of the via conductor 402 stops when the top surface of the via conductor 402 is at or about at the same level of the top opening of the via 104. The top surface of the via conductor 402 can also be at a level that is higher or lower than the top opening of the via 104. The different levels of the top surface of the via conductor 402 can be due to design or due to the process variation. In some embodiments, the via conductor 402 includes Cu, Co, Ni, Ru, Rh, Ir, Os, Al, In, W, or CNTs.

Figure 4F:
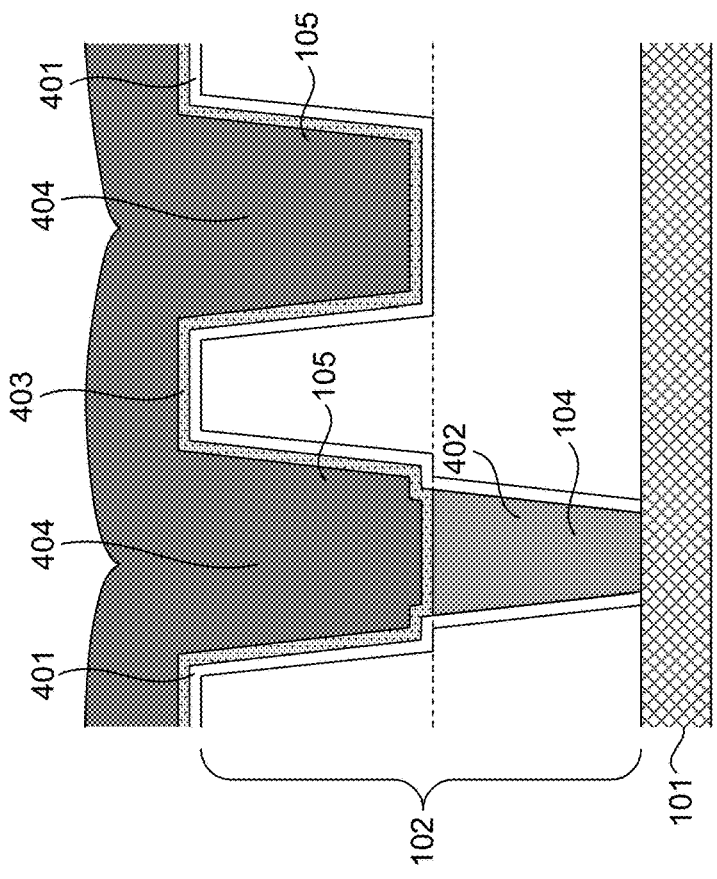
Figure 4E:
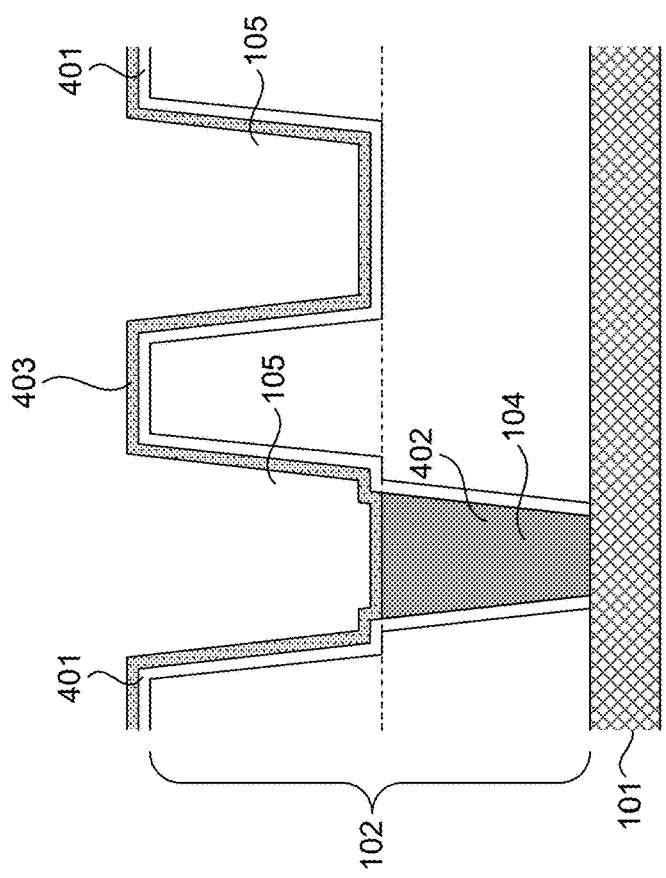

Referring to FIG. 4E, after the formation of the via conductor 402 in the via 104, a trench barrier 403 is formed on the upper surface of the trench 105, the sidewall surfaces of the trench 105, and the bottom of the trench 105. In some embodiments, the trench barrier 403 is in contact with the via conductor 402 at the overlapping area between the trench 105 and the via 104. In some embodiments, the formation of the trench barrier 403 is enabled by a PVD process, a CVD process, an ALD process, or an ELD process. In some embodiments, the process temperature for forming the trench barrier 403 is at or below 400° C. and greater than 10° C.

In some embodiments, the trench barrier 403 includes a metal (e.g., tantalum (Ta)), a metal compound (e.g., titanium nitride (TiN), tantalum nitride (TaN)), and/or a carbon containing material (e.g., graphene). In some embodiments, the thickness of the trench barrier 403 is between 1 Å and 50 Å. In some embodiments, the thickness of the trench barrier 403 thickness is between 10 Å and 30 Å. In some embodiments, the thickness of the trench barrier 403 thickness is between 15 Å and 25 Å. In some embodiments, the thickness of the trench barrier 403 thickness is between 1 Å and 10 Å.

Referring to FIG. 4F, subsequent to the formation of the trench barrier 402, a trench conductor 404 is formed in the trench 105, according to some embodiments. In some embodiments, the formation process of the trench conductor 404 includes a PVD process, a CVD process, an ALD process, or an ELD process. In some embodiments, the trench conductor 404 includes Cu, Co, Ni, Ru, Rh, Ir, Os, Al, In, W, or carbon nanotubes.

Figure 4G:
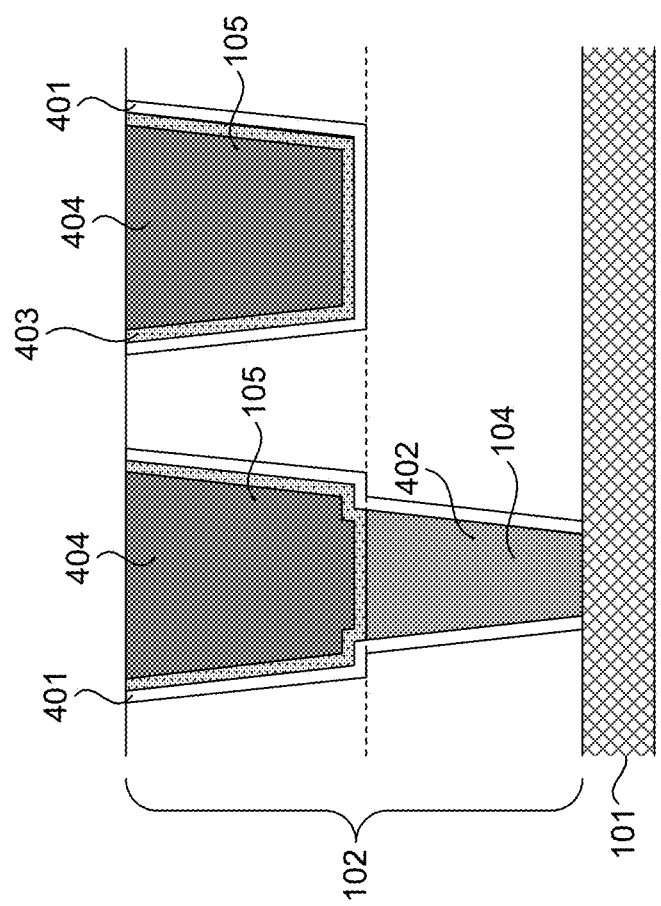

Referring to FIG. 4G, in some embodiments, the excess via-plus-trench barrier 401, trench barrier 403 and trench conductor 404 over the upper surface of the insulating material 102 are removed by a CMP process. As a result, the upper surface of the insulating material 102 is planarized and no excessive conducting material is left on the upper surface of the insulating material 102.

Figure 5B:
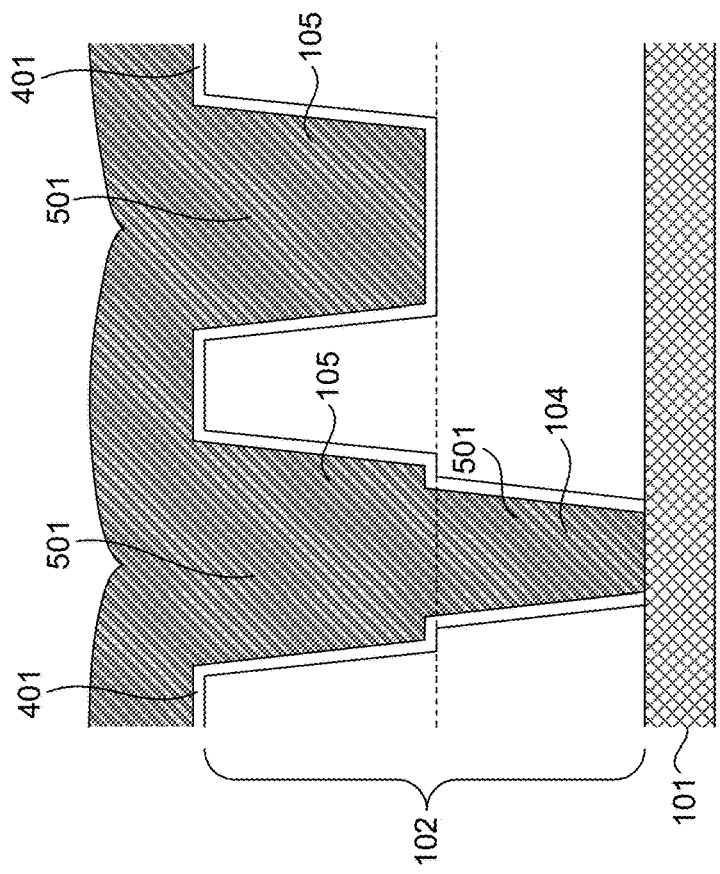
FIGS. 5A to 5C are cross sectional views of an exemplary interconnect structure formed with a dual damascene process, according to some embodiments.
Figure 5A:
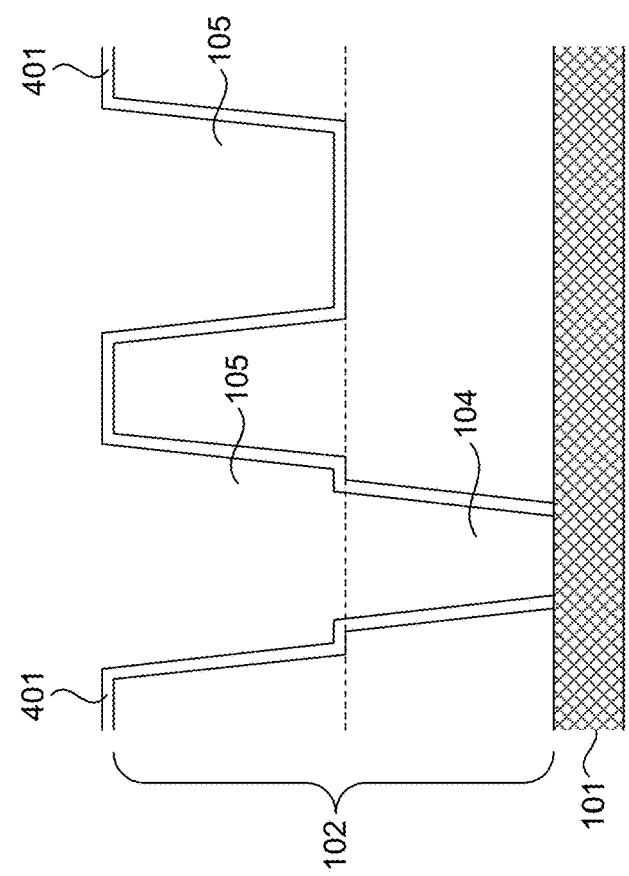
Figure 5C:
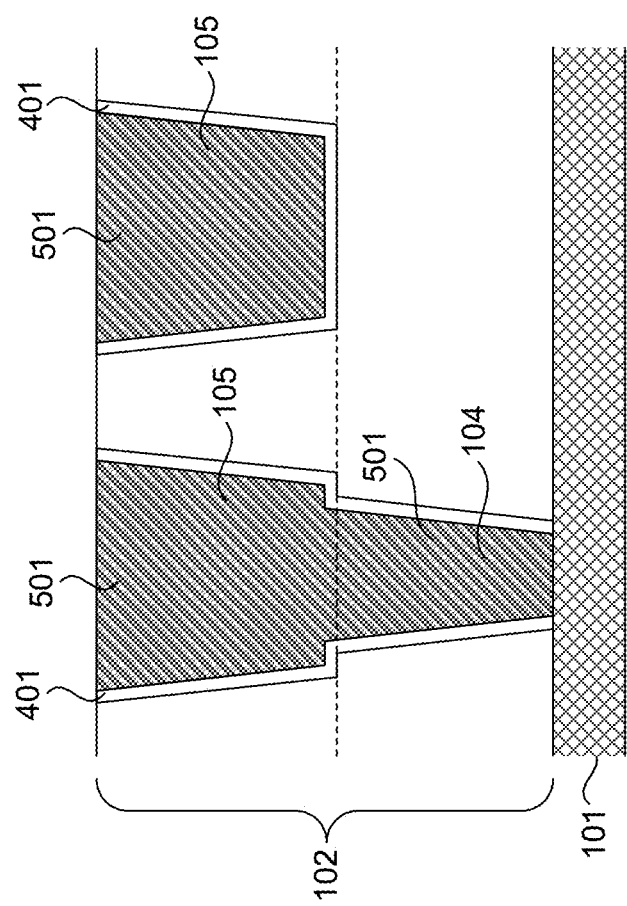

In some embodiments, an interconnect can be formed in the via and trench—using a non-selective deposition of the via-plus-trench barrier followed by a selective removal of a portion of the via-plus-trench barrier—via a dual damascene process. FIGS. 5A to 5C are cross sectional views of an exemplary interconnect structure formed with a dual damascene process. The interconnect structure is formed on the substrate 100 (not shown in FIGS. 5A to 5C).

Referring to FIG. 5A, the via-plus-trench barrier 401 is formed by non-selectively depositing the via-plus-trench barrier 401 and selectively removing the bottom portion of the via-plus-trench barrier 401. Various exemplary methods of selectively removing the bottom portion of the via-plus-trench barrier 401 are discussed previously with respect to FIGS. 4B and 4C above.

Referring to FIG. 5B, in the dual damascene process, the via 104 and trench 105 are filled with a via-plus-trench conductor 501. In some embodiments, the formation process of the via-plus-trench conductor 501 includes a PVD process, a CVD process, an ALD process, and/or an ELD process. In some embodiments, the via-plus-trench conductor 501 includes Cu, Co, Ni, Ru, Rh, Ir, Os, Al, In, W, or CNTs.

Referring to FIG. 5C, in some embodiments, the excess via-plus-trench barrier 401 and via-plus-trench conductor 501 over the upper surface of the insulating material 102 are removed by a CMP process. As a result, the upper surface of the insulating material 102 is planarized and no excessive conducting material is left on the upper surface of the insulating material 102. Unlike the structure discussed in FIG. 4G where the trench conductor 404 and via conductor 402 are electrically coupled via a trench barrier 403, the interconnect structure in FIG. 5C has one via-plus-trench conductor 501 for both the trench 105 and the via 104 with no interface between the trench conductor and via conductor. The removal of the interface between the trench conductor and the via conductor can result in a reduction in contact resistance between the trench conductor and the via conductor, according to some embodiments.

FIGS. 6A to 6E are cross sectional views of forming exemplary interconnect structures without forming a selective via-plus-trench barrier, according to some embodiments.

Figure 6B:
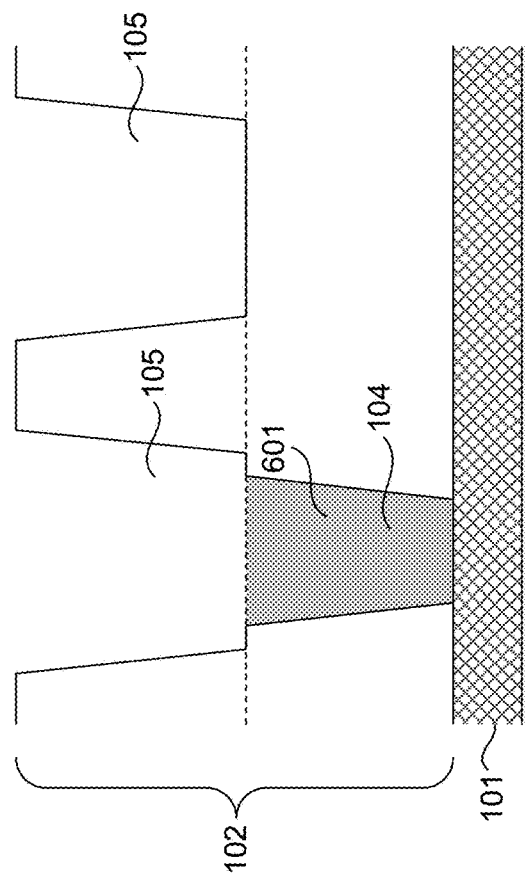
FIGS. 6A to 6E are cross sectional views of forming exemplary interconnect structures without forming a selective via-plus-trench barrier, according to some embodiments.
Figure 6A:
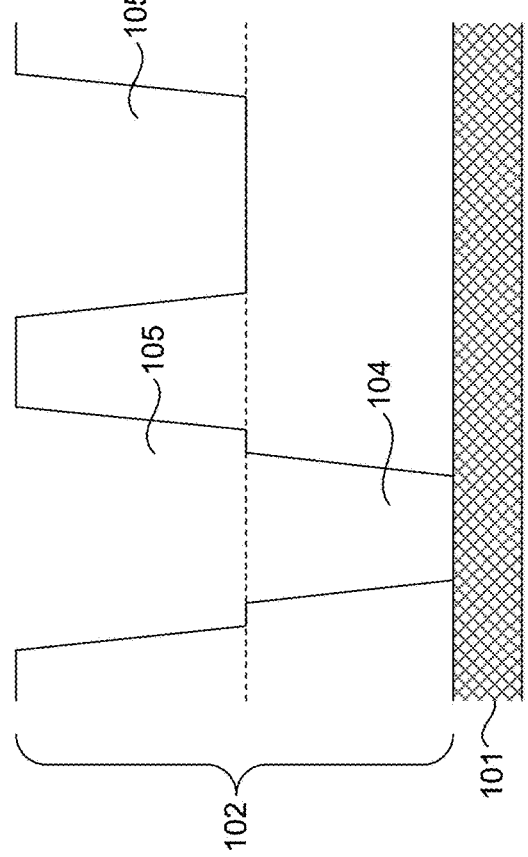

Referring to FIG. 6A, the via 104 and the trench 105 are formed in the layer of insulating material 102 on the substrate 100 (not shown in FIGS. 6A to 6E). A plurality of photolithography, deposition, dry etch, and wet etch steps can be employed to define the patterns and form the via 104 and the trench 105 in the layer of insulating material 102. In some embodiments, the via 104 and the trench 105 are formed by separate etch steps. In some embodiments, the via 104 and the trench 105 are formed by the same etch step.

Referring to FIG. 6B, instead of forming a via-plus-trench barrier, the via 104 is directly filled with a via conductor 601, according to some embodiments. In some embodiments, the formation of the via conductor 601 in the via 104 is a selective deposition process. Such selective deposition process deposits the via conductor 601 selectively on the bottom of the via 104 where there is an overlapping area between the bottom of the via 104 and the under-layer conductor 101. As a result, the deposition of the via conductor 601 progresses in a bottom-up fashion that gradually fills the via 104 from the bottom of the via to the top of the via.

In some embodiments, the selective deposition process includes a CVD process, an ALD process, or an electroless deposition (ELD) process. In some embodiments, the via conductor 601 is a material that does not diffuse into the insulating material 102. In some embodiments, the via conductor 601 includes Ru, Co, and/or CNTs. In some embodiments, the selective deposition process is a selective metal deposition process that fills the via with metal in a bottom-up fashion. In some embodiments, Ru can be deposited in a bottom-up fashion. In some embodiments, the selective deposition process is a selective CVD process that fills the via with metal in a bottom-up fashion. For example, cobalt (Co) can be deposited in a bottom-up fashion using a selective CVD process. In some embodiments, the selectivity of the selective CVD Co process is realized by choosing an appropriate precursor that forms a nucleation layer on the surface of the under-layer conductor 101. In some embodiments, the Co-containing precursor includes a Co containing compound that has —CO— groups and organic ligands in its molecule structure.

In some embodiments, as illustrated by FIG. 6B, the deposition of the via conductor 601 stops when the top surface of the via conductor 601 is at or about at the same level of the top opening of the via 104. The top surface of the via conductor 601 can also be at a level that is higher or lower than the top opening of the via 104. The different levels of the top surface of the via conductor 601 can be due to design or due to the process variation.

Figure 6D:
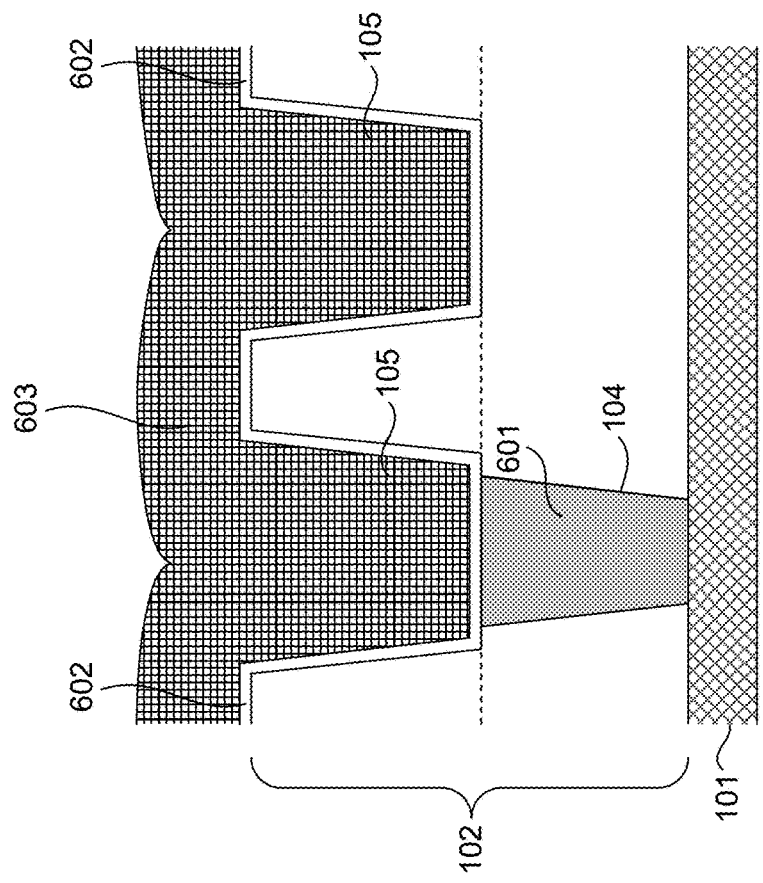
Figure 6C:
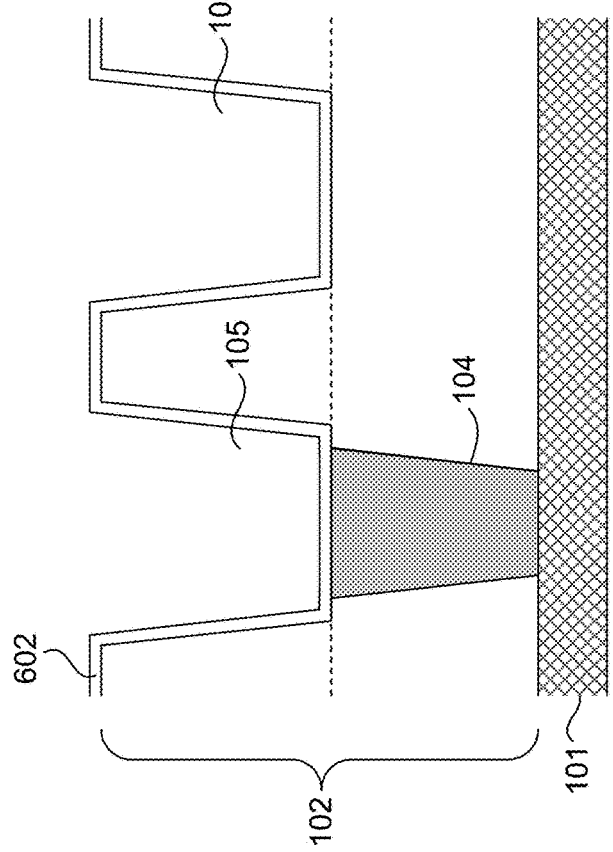

Referring to FIG. 6C, after the formation of the via conductor 601 in the via 104, a trench barrier 602 is formed on the upper surface of the trench 105, the sidewall surfaces of the trench 105 and the bottom of the trench 105. In some embodiments, the trench barrier 602 is in contact with the via conductor 601 at the overlapping area between the trench 105 and the via 104. In some embodiments, the formation of the trench barrier 602 is enabled by a PVD process, a CVD process, an ALD process, or an ELD process. In some embodiments, the process temperature for forming the trench barrier 602 is at or below 400° C. and greater than 10° C.

In some embodiments, the trench barrier 602 includes a metal (e.g., Ta, TiW, and/or other metal or metal alloys), a metal oxide (e.g., alumina, manganese oxide, chromium oxide, niobium oxide, titanium oxide, and/or combinations thereof), a metal nitride (e.g. TaN, TiN), a metal compound (e.g., alumina, manganese oxide, chromium oxide, niobium oxide, titanium oxide, and/or combinations thereof), a carbon containing material, other suitable materials, and/or combinations thereof. In some embodiments, the thickness of the trench barrier 602 is between 1 Å and 50 Å. In some embodiments, the thickness of the trench barrier 602 thickness is between 10 Å and 30 Å. In some embodiments, the thickness of the trench barrier 602 thickness is between 15 Å and 25 Å. In some embodiments, the thickness of the trench barrier 602 thickness is between 1 Å and 10 Å.

Referring to FIG. 6D, subsequent to the formation of the trench barrier 602, a trench conductor 603 is formed in the trench 105, according to some embodiments. In some embodiments, the formation process of the trench conductor 603 includes a PVD process, a CVD process, an ALD process, or an ELD process. In some embodiments, the trench conductor 603 includes Cu, Co, Ni, Ru, Rh, Ir, Os, Al, In, W, or carbon nanotubes.

Figure 6E:
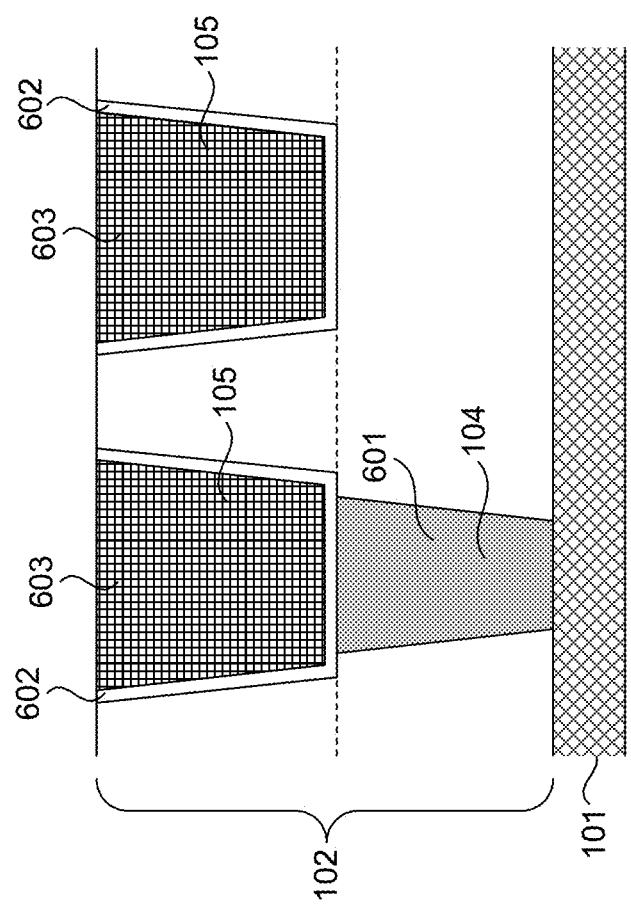

Referring to FIG. 6E, in some embodiments, the excess trench barrier 602 and trench conductor 603 over the upper surface of the insulating material 102 are removed by a CMP process. As a result, the upper surface of the insulating material 102 is planarized and no excessive conducting material is left on the upper surface of the insulating material 102.

FIGS. 7A to 7D are cross sectional views of forming exemplary interconnect structures with a self-forming barrier via a dual damascene process, according to some embodiments.

Figures 7A, 7B:
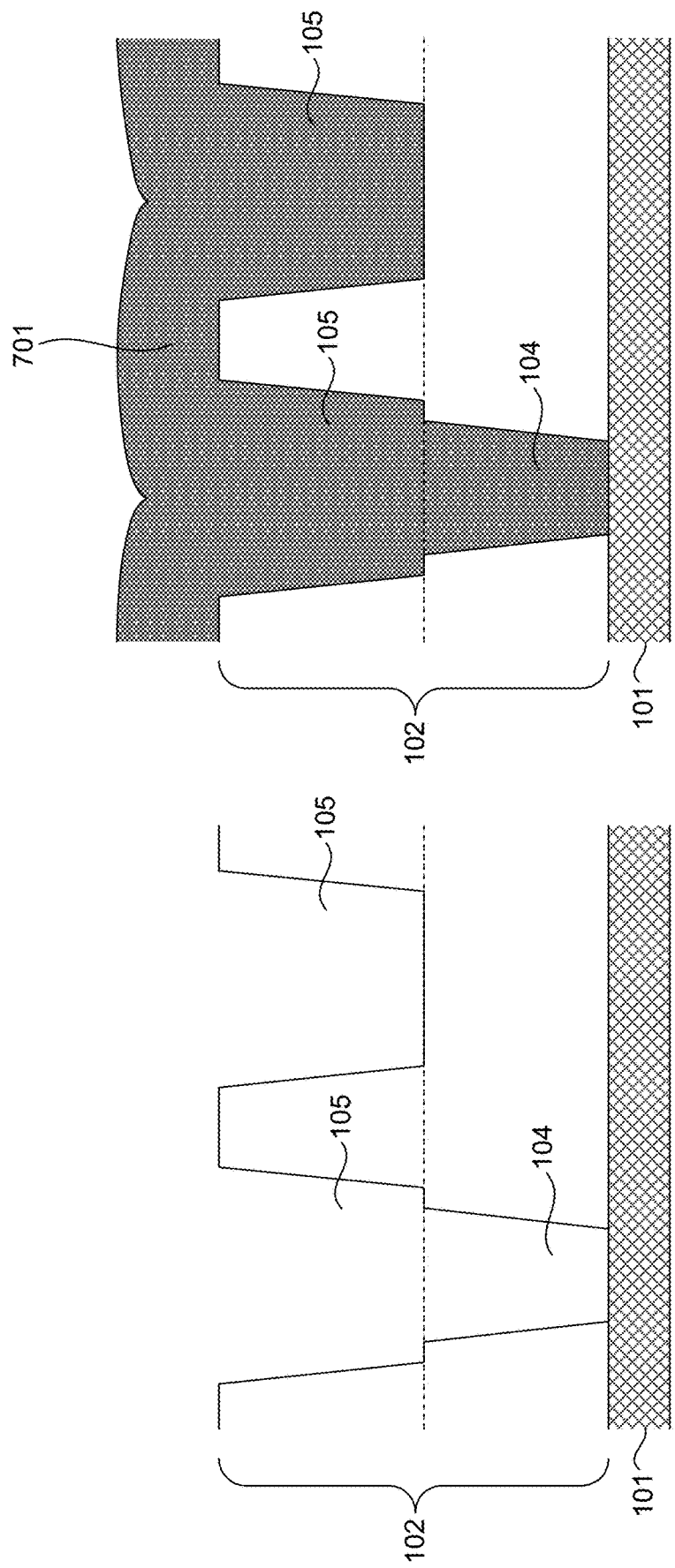
FIGS. 7A to 7D are cross sectional views of forming exemplary interconnect structures with a self-forming barrier, according to some embodiments.

Referring to FIG. 7A, the via 104 and the trench 105 are formed in the layer of insulating material 102 on the substrate 100 (not shown in FIGS. 7A to 7D). A plurality of photolithography, deposition, dry etch, and wet etch steps are employed to define the patterns and form the via 104 and the trench 105 in the layer of insulating material 102. In some embodiments, the via 104 and the trench 105 are formed by separate etch steps. In some embodiments, the via 104 and the trench 105 are formed by the same etch step.

Referring to FIG. 7B, in some embodiments, the via 104 and the trench 105 are filled at the same time with the dual damascene process. In the dual damascene process, the via 104 and trench 105 are filled with a via-plus-trench conductor 701. The via-plus-trench conductor 701 is in contact with the insulating material 102. In some embodiments, filling the via 104 and trench 105 with the via-plus-trench conductor 701 includes a PVD process, a CVD process, an ALD process, and/or an ELD process. In some embodiments, the via-plus-trench conductor 701 includes a metal (e.g., Cu) alloyed with B, Al, Ti, Cr, Mn, Nb, Pd, tin (Sn), zinc (Zn), magnesium (Mg), Ag, In, or Au.

Figure 7D:
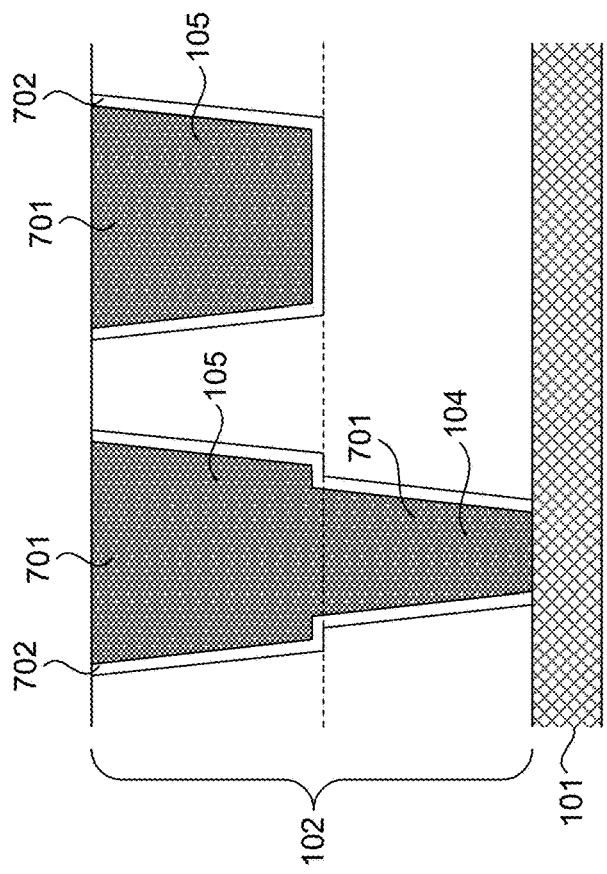
Figure 7C:
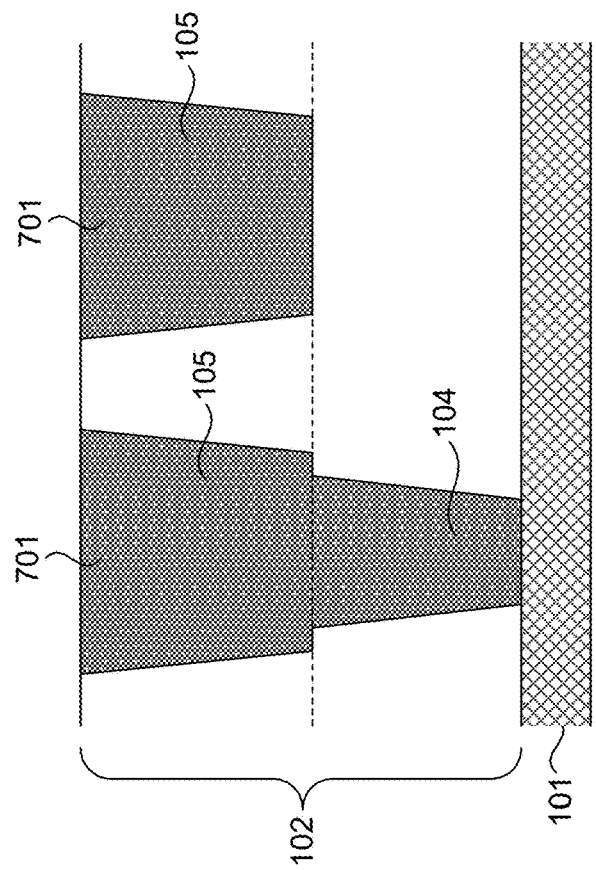

Referring to FIG. 7C, in some embodiments, the via-plus-trench conductor 701 is planarized with a CMP process, leaving no excess via-plus-trench conductor 701 on the upper surface of the insulating material 102.

Referring to FIG. 7D, subsequent to the planarization of the via-plus-trench conductor 701, a self-forming barrier 702 is formed on the sidewall surfaces of the trench 105, the bottom of the trench 105, and the sidewall surfaces of the via 104. In some embodiments, the self-forming barrier 702 is formed by treating the interconnect structure with a thermal or an electrical treatment process. In some embodiments, the treatment process causes the via-plus-trench conductor 701 or the dopants in the via-plus-trench conductor 701 to react with the insulating material 102. In some embodiments, the treatment drives the dopants via thermal diffusion or electrical drifting to the interface between the insulating material 102 and the via-plus-trench conductor 701, and the dopants subsequently form a diffusion barrier.

In some embodiments, the via-plus-trench conductor 701 can be Cu alloyed with Mn, where the Mn has a weight percentage in the alloy between 0.5% and 10%. The under-layer conductor 101 can be Cu. In some embodiments, the insulating material 102 is silicon dioxide (SiO2). With a thermal treatment between 250° C. and 400° C., Mn diffuses to the interface between the via-plus-trench conductor 701 and insulating materials 102, and Mn further reacts with SiO2 in the insulating material 102 and forms a layer of self-forming barrier 702, as illustrated by FIG. 7D. In some embodiments, the self-forming barrier 702 is in a form of manganese oxide (MnOx) or manganese silicon oxide (MnSiOx). The self-forming barrier 702 is not formed at the bottom of the via 104 because Mn does not form MnOx or MnSiOx with the under-layer conductor 101 (e.g., Cu). As a result, the self-forming barrier 702 is formed on the sidewall of the trench 105, the bottom of the trench 105, and the sidewall of the via 104. No self-forming barrier 702 is formed on the upper surface of the under-layer conductor 101 at the bottom of the via 104.

Figure 8:
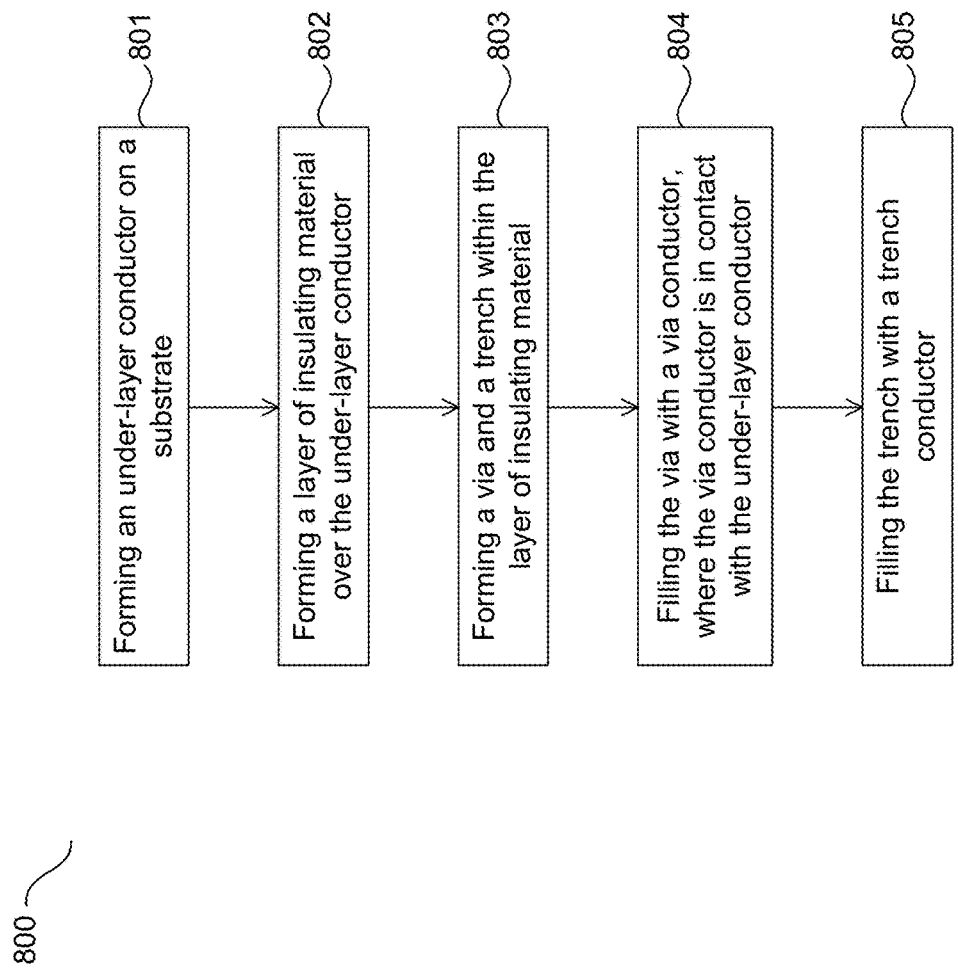
FIG. 8 is a flow diagram of an example method of forming exemplary interconnect structures, according to some embodiments.

FIG. 8 is a flow diagram of an example method 800 of forming exemplary interconnect structures, according to some embodiments. Based on the disclosure herein, other operations in method 800 can be performed. Further, the operations of method 800 can be performed in a different order and/or vary.

At operation 801, an under-layer conductor is formed on and/or within a semiconductor substrate. The semiconductor structure can include bulk silicon (e.g., doped or undoped silicon) or an active layer of a silicon-on-insulator (SOI) substrate. The semiconductor structure can include semiconductor material such as, for example, silicon, germanium, silicon germanium, silicon germanium on insulator (SGOI), or combinations thereof. Active devices can be formed on and/or within the semiconductor substrate. Active and passive devices such as, for example, transistors, diodes, capacitors, resistors, inductors, and the like can be formed.

In some embodiments, the under-layer conductor includes copper (Cu), cobalt (Co), nickel (Ni), ruthenium (Ru), rhodium (Rh), iridium (Ir), osmium (Os), aluminum (Al), indium (In), silver (Ag), gold (Au), tungsten (W), or carbon nanotubes. In some embodiments, the under-layer conductor includes metals alloyed with boron (B), aluminum (Al), titanium (Ti), chromium (Cr), manganese (Mn), niobium (Nb), palladium (Pd), silver (Ag), indium (In), tin (Sn), zinc (Zn), or gold (Au).

At operation 802, a layer of insulating material is formed over the under-layer conductor. In some embodiments, the layer of insulating material is formed by chemical vapor deposition (CVD), plasma enhanced chemical vapor deposition (PECVD), a spin-on process, physical vapor deposition (PVD), or Atomic Layer Deposition (ALD). In some embodiments, the layer of insulating material includes silicon oxide (SiOx), doped silicate glass, and/or various low-k dielectrics.

At operation 803, a via and a trench is formed within the insulating material. A plurality of photolithography, deposition, dry etch, and wet etch steps can be employed to define the patterns and form the via and the trench in the layer of insulating material. In some embodiments, the via and the trench are formed by separate etch steps. In some embodiments, the via and the trench are formed by the same etch step.

At operation 804, the via is filled with a via conductor. According to some embodiments, a single damascene process can be employed to fill the via and the trench in separate steps. In some embodiments, the via is filled with the via conductor in a selective deposition process. Such selective deposition process deposits the via conductor selectively on the bottom of the via where there is an overlapping area between the bottom of the via and the under-layer conductor. As a result, the deposition of the via conductor inside the via progresses in a bottom-up fashion that gradually fills the via from the bottom of the via to the top of the via. According to some embodiments, due to the selective deposition of the via-conductor, there is no barrier between the via conductor and the under-layer conductor, and the via conductor is in contact with the under-layer conductor.

In some embodiments, the selective deposition of the via conductor includes a CVD process, an ALD process, or an electroless deposition (ELD) process. In some embodiments, the selective deposition of the via conductor is a selective metal deposition process that fills the via with metal in a bottom-up fashion. In some embodiments, Cu is deposited in a bottom-up fashion. In some embodiments, the selective deposition of the via conductor is a selective CVD metal process that fills the via with metal in a bottom-up fashion. In some embodiments, Co is deposited in a bottom-up fashion using the selective CVD metal process. In some embodiments, the selectivity of the selective CVD Co process is realized by choosing an appropriate precursor that forms a nucleation layer on the surface of the under-layer conductor 101. In some embodiments, the Co precursor includes a Co containing compound that has —CO— groups and organic ligands in its molecule structure.

At operation 805, the trench is filled with a trench conductor. In some embodiments, the formation process of the trench conductor includes a PVD process, a CVD process, an ALD process, or an ELD process. In some embodiments, the trench conductor includes Cu, Co, Ni, Ru, Rh, Ir, Os, Al, In, W, or carbon nanotubes.

In some embodiments, prior to filling the trench with the trench conductor, a trench barrier can be formed on the upper surface of the trench, the sidewall surfaces of the trench and the bottom of the trench. In some embodiments, the trench barrier is in contact with the via conductor at the overlapping area between the trench and the via. In some embodiments, the formation of the trench barrier is performed by a PVD process, a CVD process, an ALD process, or an ELD process. In some embodiments, the process temperature for forming the trench barrier is at or below 400° C. and greater than about 10° C.

The absence of a barrier between the under-layer conductor and the via conductor provides benefits to the interconnect structures. These benefits include a reduction in contact resistance between the via conductor and the under-layer conductor, thereby reducing the overall interconnect structure resistance and improving the speed of the device. In addition, in some embodiments, the absence of a barrier at the bottom and the sidewall of the via provides additional room for the via conductor and reduces the resistance of the via conductor, which also reduces the overall resistance of the interconnect structure.

In some embodiments, an interconnect structure includes a first layer of conducting material. The interconnect structure can also include a layer of insulating material above the first layer of conducting material. The interconnect structure also includes a via formed in the layer of insulating material. A bottom of the via is open to the first layer of conducting material. The interconnect structure also includes a trench formed above the via in the layer of insulating material. The interconnect structure also includes a second layer of conducting material formed in the via. The second layer of conducting material is in contact with the first layer of conducting material. The interconnect structure also includes a third layer of conducting material formed in the trench.

In some embodiments, a method of fabricating an interconnect structure includes forming a first layer of conducting material. A layer of insulating material is formed over the first layer of conducting material. A via is formed within the insulating material, and a bottom of the via is open to the first layer of conducting material. A trench is formed above the via and in the insulating material. The via is filled with a second layer of conducting material, and the second layer of conducting material is in contact with the first layer of conducting material. The trench is filled with a third layer of conducting material.

In some embodiments, an interconnect structure includes a first layer of conducting material. The interconnect structure can also include a layer of insulating material above the first layer of conducting material. The interconnect structure also includes a via formed in the layer of insulating material. A bottom of the via is open to the first layer of conducting material. The interconnect structure also includes a trench formed in the layer of insulating material. A portion of a bottom of the trench is in contact with a top of the via. The interconnect structure also includes a second layer of conducting material formed in the via. The second layer of conducting material is in contact with the first layer of conducting material. The interconnect structure also includes a third layer of conducting material formed in the trench. A portion of a bottom of the third layer of conducting material overlaps with the top of the via. The interconnect structure also includes a via-plus-trench barrier formed on a sidewall of the via, a sidewall of the trench, and a bottom of the trench.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The foregoing disclosure outlines features of several embodiments so that a person of ordinary skill in the art may better understand the aspects of the present disclosure. A person of ordinary skill in the art will appreciate that they may readily use the present disclosure as a basis for designing or modifying other processes and structures for carrying out the same purposes and/or achieving the same advantages of the embodiments introduced herein. A person of ordinary skill in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an insulating layer over a first conductive layer;
    forming a via opening in the insulating layer to expose a portion of the first conductive layer;
    forming a sacrificial layer on the portion of the first conductive layer;
    forming a first portion of a barrier layer on the sacrificial layer and a second portion of the barrier layer over a sidewall of the via opening;
    removing the first portion of the barrier layer and sacrificial layer to expose the portion of the first conductive layer, wherein removing the sacrificial layer comprises selectively etching the sacrificial layer with an organic solvent in a lift-off process; and
    filling the via opening with a second conductive layer.

2. The method of claim 1, wherein forming the first and second portions of the barrier layer comprises forming the first and second portions of the barrier layer by a chemical vapor deposition (CVD) process, an atomic layer deposition (ALD) process, or a physical vapor deposition (PVD) process at a temperature ranging from about 10° C. to about 400° C.

3. The method of claim 1, wherein filling the via opening with the second conductive layer comprises filling the via opening with a metal from a bottom of the via opening to a top of the via opening.

4. The method of claim 1, wherein filling the via opening with the second conductive layer comprises depositing a cobalt-containing compound, and wherein the cobalt-containing compound comprises a carbonyl group and an organic ligand.

5. The method of claim 1, further comprising:
forming a trench opening in the insulating layer and above the via opening; and
forming a trench barrier layer on the second conductive layer and over a sidewall of the trench opening.

6. The method of claim 5, wherein forming the trench barrier layer comprises depositing a metal, a metal compound, a carbon-containing material, and combinations thereof.

7. The method of claim 1, further comprising:
forming a trench opening in the insulating layer and above the via opening; and
filling the trench opening with a third conductive layer.

8. The method of claim 7, wherein filling the trench opening with the third conductive layer comprises:
depositing a metal in the trench opening; and
planarizing the metal by a chemical mechanical planarization (CMP) process.

9. The method of claim 1, further comprising forming a trench opening in the insulating layer and above the via opening, wherein filling the via opening with the second conductive layer comprises filling the via opening and the trench opening with the second conductive layer by a dual damascene process.

10. A method, comprising:
forming an insulating layer over a first conductive layer;
forming a via-plus-trench opening in the insulating layer to expose a portion of the first conductive layer;
forming a monolayer on the portion of the first conductive layer and a sidewall of the via-plus-trench opening;
forming a barrier layer on the sidewall of the via-plus-trench opening, wherein the monolayer inhibits formation of the barrier layer on a bottom surface of the via-plus-trench opening and enhances the formation of the barrier layer on the sidewall of the via-plus-trench opening;
filling a via portion of the via-plus-trench opening with a second conductive layer; and
filling a trench portion of the via-plus-trench opening with a third conductive layer.

11. The method of claim 10, wherein filling the via portion of the via-plus-trench opening with the second conductive layer comprises filling the via portion of the via-plus-trench opening with a metal in a bottom-up process.

12. The method of claim 10, further comprising forming a trench barrier layer on the second conductive layer and over a sidewall of the trench portion of the via-plus-trench opening.

13. The method of claim 10, further comprising forming the monolayer by a vapor phase or a liquid phase process.

14. The method of claim 10, further comprising forming the barrier layer at a temperature between about 10° C. and about 400° C.

15. A method, comprising:
forming an insulating layer over a first conductive layer;
forming a via opening in the insulating layer to expose a portion of the first conductive layer;
forming a monolayer on the portion of the first conductive layer and on a sidewall of the via opening;
forming a barrier layer over a sidewall of the via opening, wherein the monolayer inhibits formation of the barrier layer on portion of the first conductive layer and enhances the formation of the barrier layer on the sidewall of the via opening; and
filling the via opening with a second conductive layer, wherein the second conductive layer is a cobalt-containing compound comprising a carbonyl group and an organic ligand.

16. The method of claim 15, further comprising:
forming a trench opening in the insulating layer and above the via opening;
forming a trench barrier on the second conductive layer and over a sidewall of the trench opening;
depositing a third conductive layer in the trench opening; and
planarizing the third conductive layer by a chemical mechanical planarization (CMP) process.

17. The method of claim 16, further comprising forming the trench barrier at a temperature between about 10° C. and about 400° C.

18. The method of claim 15, further comprising forming a trench opening in the insulating layer and above the via opening, wherein filling the via opening with the second conductive layer comprises filling the via opening and the trench opening with the second conductive layer by a dual damascene process.

19. The method of claim 15, further comprising forming another monolayer on the portion of the first conductive layer.

20. The method of claim 15, further comprising forming the monolayer by a vapor phase or a liquid phase process.

* * * * *